(12) United States Patent
Choe

(10) Patent No.: US 11,770,960 B2
(45) Date of Patent: Sep. 26, 2023

(54) COLOR FILTER UNIT AND DISPLAY APPARATUS INCLUDING THE SAME

(71) Applicant: Samsung Display Co., Ltd., Yongin-si (KR)

(72) Inventor: Wonkyu Choe, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 367 days.

(21) Appl. No.: 16/985,968

(22) Filed: Aug. 5, 2020

(65) Prior Publication Data

US 2021/0074770 A1 Mar. 11, 2021

(30) Foreign Application Priority Data

Sep. 9, 2019 (KR) ........................ 10-2019-0111557

(51) Int. Cl.
| | |
|---|---|
| *H01L 51/52* | (2006.01) |
| *H10K 59/38* | (2023.01) |
| *G02B 5/02* | (2006.01) |
| *G02B 5/20* | (2006.01) |
| *H10K 50/844* | (2023.01) |

(Continued)

(52) U.S. Cl.
CPC ............ *H10K 59/38* (2023.02); *G02B 5/0242* (2013.01); *G02B 5/0278* (2013.01); *G02B 5/20* (2013.01); *H10K 50/844* (2023.02); *H10K 50/854* (2023.02); *H10K 59/12* (2023.02)

(58) Field of Classification Search
CPC ............... H01L 27/322; H01L 51/5253; H01L 51/5268; H01L 27/3244; H01L 27/3246; H01L 27/3232; H01L 51/5275; H01L 51/5284; G02B 5/0242; G02B 5/0278; G02B 5/20; G02B 5/201; G02B 5/206; G02B 5/207; G02B 5/22
See application file for complete search history.

(56) References Cited

U.S. PATENT DOCUMENTS

| | | |
|---|---|---|
| 9,064,822 B2 | 6/2015 | Park et al. |
| 9,720,149 B2 | 8/2017 | Wu et al. |
| 9,954,147 B2 | 4/2018 | Pentlehner |

(Continued)

FOREIGN PATENT DOCUMENTS

| | | |
|---|---|---|
| JP | 2005-302313 A | 10/2005 |
| JP | 2016-218151 A | 12/2016 |

(Continued)

*Primary Examiner* — Donald L Raleigh
(74) *Attorney, Agent, or Firm* — Lewis Roca Rothgerber Christie LLP

(57) ABSTRACT

A color filter unit having improved optical efficiency and color reproduction and a display apparatus including the color filter unit are provided. The display apparatus includes a first pixel, a second pixel, and a third pixel on a first substrate, the first pixel, the second pixel, and the third pixel are configured to emit light of different colors from one another, wherein each of the first pixel and the second pixel includes a display element, a light scattering layer corresponding to the display element, the light scattering layer comprising first scattering particles and first quantum dots, and a color conversion layer on the light scattering layer, the color conversion layer including second scattering particles and second quantum dots configured to convert incident light into light of a set color.

28 Claims, 18 Drawing Sheets

(51) Int. Cl.
    *H10K 50/854*     (2023.01)
    *H10K 59/12*     (2023.01)

(56) References Cited

U.S. PATENT DOCUMENTS

| | | | |
|---|---|---|---|
| 9,971,198 B2 * | 5/2018 | Cho | G02F 1/133617 |
| 2008/0272690 A1 | 11/2008 | Kuma et al. | |
| 2012/0087107 A1 * | 4/2012 | Kunimasa | G02F 1/133617 |
| | | | 362/84 |
| 2014/0293392 A1 | 10/2014 | Ninan et al. | |
| 2015/0228697 A1 | 8/2015 | Liu et al. | |
| 2017/0331064 A1 | 11/2017 | Trummer-Sailer et al. | |
| 2018/0224698 A1 | 8/2018 | Qi et al. | |
| 2019/0198573 A1 * | 6/2019 | Kim | H01L 27/322 |
| 2020/0051959 A1 * | 2/2020 | Pschenitzka | H01L 33/505 |
| 2022/0006062 A1 * | 1/2022 | Li | H01L 51/5284 |
| 2022/0019000 A1 * | 1/2022 | Padiyath | B29C 66/0382 |

FOREIGN PATENT DOCUMENTS

| | | | | |
|---|---|---|---|---|
| KR | 10-0572316 B1 | 4/2006 | | |
| KR | 10-1275656 B1 | 6/2017 | | |
| WO | WO-2011145418 A1 * | 11/2011 | ........... | C09K 11/665 |
| WO | WO-2015025950 A1 * | 2/2015 | ........... | C09K 11/671 |

\* cited by examiner

COLOR FILTER UNIT AND DISPLAY APPARATUS INCLUDING THE SAME

CROSS-REFERENCE TO RELATED APPLICATION

This application claims priority to and the benefit of Korean Patent Applications No. 10-2019-0111557, filed on Sep. 9, 2019, in the Korean Intellectual Property Office (KIPO), the entire disclosure of which is incorporated herein by reference.

BACKGROUND

1. Field

One or more embodiments relate to a color filter unit and a display apparatus including the color filter unit, and more particularly, to a color filter unit having improved optical efficiency and color reproduction and a display apparatus including the color filter unit.

2. Description of Related Art

A display apparatus visually displays images. A display apparatus may be used as a display in a small-sized product (e.g., a mobile phone) or a large-sized product (e.g., a television).

A display apparatus includes a plurality of pixels that emit light by receiving electrical signals to externally display images. Each of the pixels of the display apparatus includes a light-emitting device. For example, an organic-light emitting display apparatus includes an organic light-emitting diode OLED as a light-emitting device. In general, thin film transistors and organic light-emitting diodes are on a substrate and the organic light-emitting diodes emit light by themselves to operate an organic light-emitting display apparatus.

Recently, usages of a display apparatus have been increased, and various design attempts for improving the quality of a display apparatus have been tried. In particular, as a resolution of a display apparatus increases, research has been conducted to improve color reproduction of each pixel in a display apparatus.

SUMMARY

One or more aspects of embodiments of the present disclosure are directed toward a color filter unit having improved optical efficiency and color reproduction and a display apparatus including the color filter unit. However, the above technical features are exemplary and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus includes a first pixel, a second pixel, and a third pixel on a first substrate, the first pixel, the second pixel, and the third pixel are configured to emit light of different colors from one another, each of the first pixel and the second pixel includes a display element, a light scattering layer corresponding to the display element, the light scattering layer including first scattering particles and first quantum dots, and a color conversion layer on the light scattering layer, the color conversion layer including second scattering particles and second quantum dots configured to convert incident light into light of a set color.

A concentration of the first scattering particles in the light scattering layer of the first pixel may be different from a concentration of the second scattering particles in the color conversion layer of the first pixel.

A concentration of the first quantum dots in the light scattering layer of the first pixel may be different from a concentration of the second quantum dots in the color conversion layer of the first pixel.

The concentration of the first scattering particles of the first pixel may be equal to or greater than twice the concentration of the second scattering particles of the first pixel.

The concentration of the second quantum dots of the first pixel may be equal to or greater than twice the concentration of the first quantum dots of the first pixel.

The display apparatus may further include a first transmission layer corresponding to the third pixel, the first transmission layer including the first scattering particles, and a second transmission layer between the first transmission layer and the second substrate, the second transmission layer including the second scattering particles.

A concentration of the first scattering particles in the second transmission layer may be greater than a concentration of the second scattering particles in the first transmission layer.

The third pixel may emit blue light.

The display apparatus may further include plurality of color filters respectively corresponding to the first pixel, the second pixel, and the third pixel, the plurality of color filters being configured to selectively transmit light of a set color.

The display apparatus may further include first light blocking layers located among the plurality of color filters.

The display apparatus may further include second light blocking layers respectively between the color conversion layers of the first pixel and the second pixel and the second transmission layer.

The display apparatus may further include third light blocking layers respectively between the light scattering layers of the first pixel and the second pixel and the first transmission layer.

A second light blocking layer of the second light blocking layers and a third light blocking layer of the third light blocking layers may each have an inversely-tapered side surface.

A second light blocking layer of the second light blocking layers and a third light blocking layer of the third light blocking layers may each have a tapered side surface.

The display apparatus may further include a first inorganic insulating layer between the plurality of color filters, and the color conversion layer and the second transmission layer.

The display apparatus may further include a second inorganic insulating layer between the color conversion layer and the light scattering layer and between the second transmission layer and the first transmission layer.

The display apparatus may further include a second substrate facing the first substrate, wherein the plurality of color filters may be directly on the second substrate.

The display apparatus may further include a thin film encapsulation layer on the first pixel, the second pixel, and the third pixel, the thin film encapsulation layer including an inorganic encapsulation layer and an organic encapsulation layer.

The light scattering layer and the first transmission layer may be on the thin film encapsulation layer.

The display apparatus may further include a third inorganic insulating layer covering the light scattering layer and the third light blocking layers.

The first pixel, the second pixel, and the third pixel may respectively further include a first light extraction layer, a second light extraction layer, and a third light extraction layer neighboring with the plurality of color filters, and the first light extraction layer, the second light extraction layer, and the third light extraction layer include the third scattering particles.

The third scattering particles may be included in the first light extraction layer, the second light extraction layer, and the third light extraction layer with the same concentration.

According to another embodiment, a color filter unit includes a base material layer, a plurality of color filters on the base material layer, the plurality of color filters being spaced apart from one another, a light scattering layer corresponding to at least one of the plurality of color filters, and a color conversion layer between the plurality of color filters and the light scattering layer, the color conversion layer being configured to convert incident light into light of a set color, wherein the light scattering layer includes first quantum dots and first scattering particles, and the color conversion layer includes second quantum dots and second scattering particles.

A concentration of the first scattering particles in the light scattering layer may be greater than a concentration of the second scattering particles in the color conversion layer.

A concentration of the second quantum dots in the color conversion layer may be greater than a concentration of the first quantum dots in the light scattering layer.

The color filter unit may further include a first transmission layer corresponding to at least one of the plurality of color filters, and a second transmission layer between the base material layer and the first transmission layer, wherein the first transmission layer may include the first scattering particles, and the second transmission layer may include the second scattering particles.

A concentration of the second scattering particles in the second transmission layer may be greater than a concentration of the first scattering particles in the first transmission layer.

The color filter unit may further include light blocking layers in spaces among the plurality of color filters.

The color filter unit may further include a first inorganic insulating layer between the plurality of color filters and the color conversion layer, and a second inorganic insulating layer between the color conversion layer and the light scattering layer.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
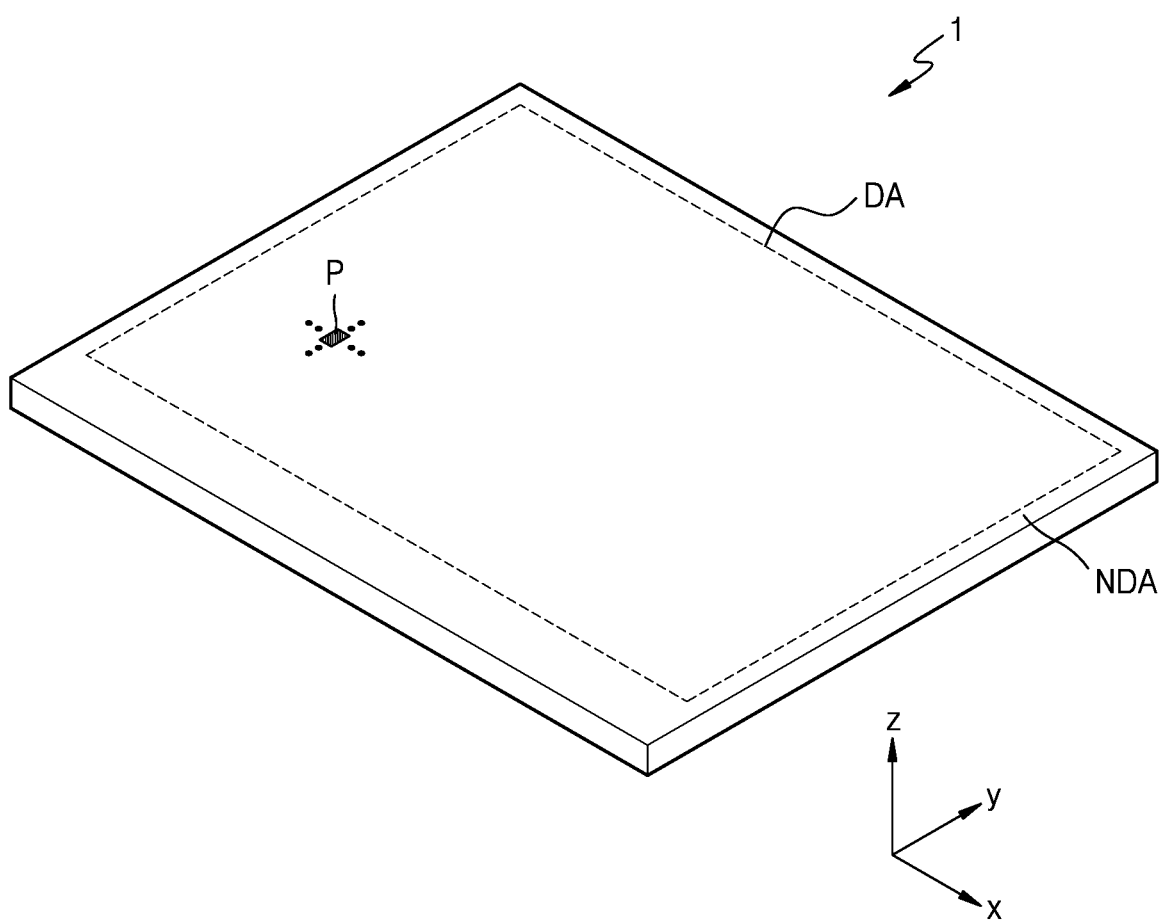
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the specification, the phrase "a and/or b" denotes a, b, or a and b. In addition, the phrase "at least one of a and b" denotes a, b, or a and b.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, "a plan view" may refer to a view from top or from a direction normal to the display area of the display apparatus.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a display area DA and a non-display area NDA, wherein the display area DA displays images and the non-display area NDA does not display images. In one or more embodiments, the display area DA includes a plurality of pixels P to emit light from the display area DA. The display apparatus 1 may provide images by using light emitted from the display area DA.

In FIG. 1, the display apparatus 1 includes the display area DA having a square shape, but one or more embodiments are not limited thereto. The display area DA may have a circular shape, an ellipse shape, or a polygonal shape such as a triangle, a pentagon, etc. Also, although the display apparatus 1 of FIG. 1 is depicted as a flat panel display apparatus, in one or more embodiments, the display apparatus 1 may be implemented as various types (e.g., a flexible display apparatus, a foldable display apparatus, a rollable display apparatus, etc).

In one or more embodiments, the display apparatus 1 may include a component. The component may be at a side of a first substrate 100 (e.g., see FIG. 2) to correspond to the display area DA or the non-display area NDA.

The component may be or include any suitable electronic element using light and/or sound. For example, the electronic element may be or include a light-receiving sensor such as an infrared-ray (IR) sensor, a camera capturing an image by receiving light, a sensor for outputting and sensing light and/or sound (e.g., to measure a distance or recognize a fingerprint, etc.), a small-sized lamp illuminating light, a speaker for outputting sound, etc.

Hereinafter, the display apparatus 1 according to an embodiment is described as an organic light-emitting display apparatus as an example, but the display apparatus 1 is not limited thereto. In another embodiment, the display apparatus 1 may include an inorganic light-emitting display apparatus, an inorganic electroluminescence (EL) display apparatus, a quantum dot light-emitting display apparatus, etc. For example, a light-emitting layer of a display element included in the display apparatus 1 may include an organic material, an inorganic material, quantum dots, an organic material and quantum dots, an inorganic material and quantum dots, or an organic material, an inorganic material, and quantum dots.

Figure 2:
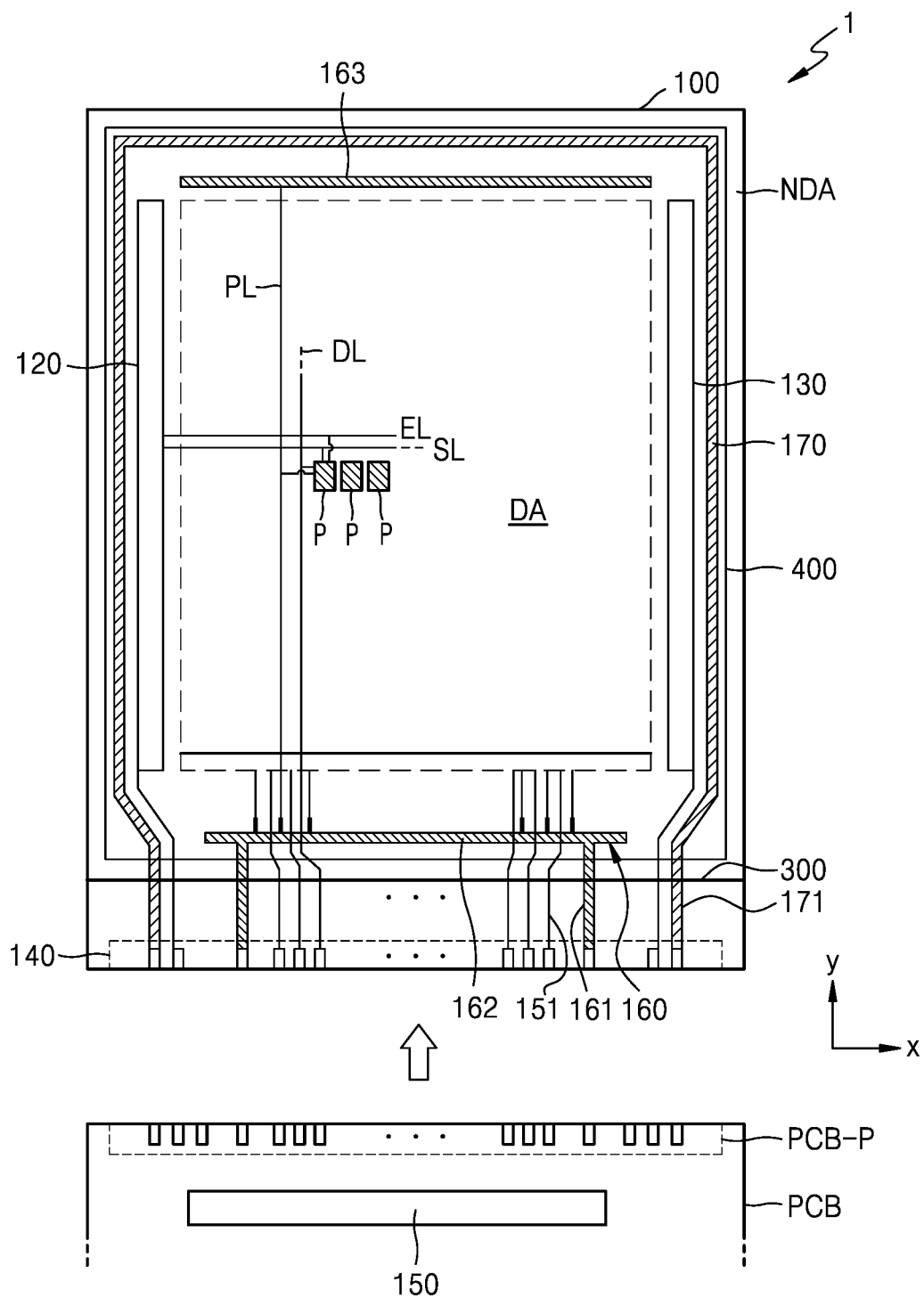
FIG. 2 is a plan view of a display apparatus according to an embodiment.

FIG. 2 is a plan view of the display apparatus 1 according to the embodiment.

Referring to FIG. 2, the display apparatus 1 includes a plurality of pixels P in the display area DA of a first substrate 100. Each of the plurality of pixels P may include a display element such as an organic light-emitting diode OLED (e.g., see FIG. 3). Each of the pixels P may emit light, (e.g., red light, green light, blue light, or white light), from the organic light-emitting diode.

In the specification, each pixel P may denote a sub-pixel emitting light of a different color from the others, and each pixel P may be one of, for example, a red (R) sub-pixel, a green (G) sub-pixel, and a blue (B) sub-pixel.

Figure 4:
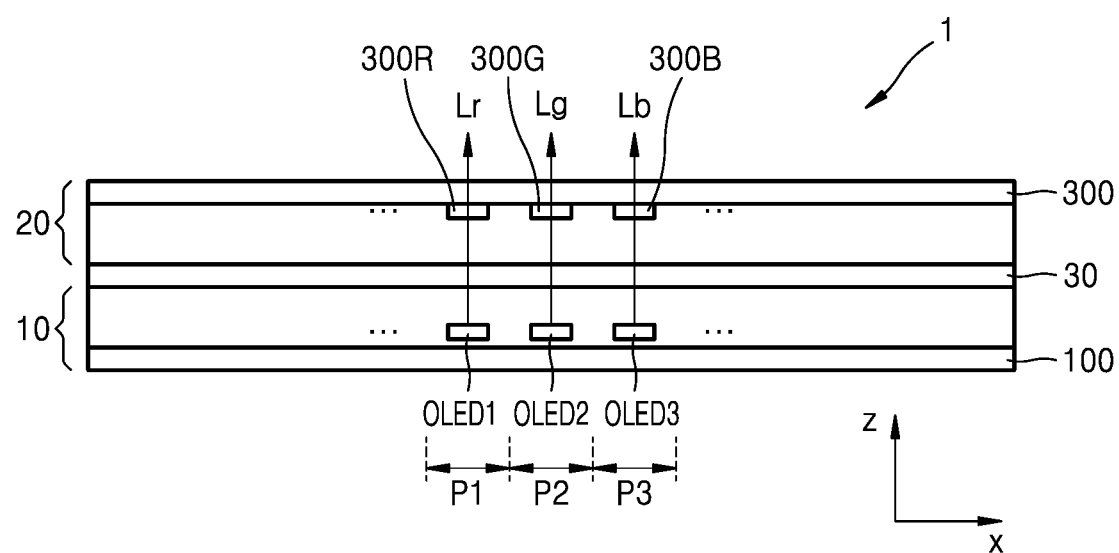
FIGS. 4 and 5 are cross-sectional views of a display apparatus according to an embodiment.

A second substrate 300 may be over the first substrate 100. The second substrate 300 may face the first substrate 100 with elements on the first substrate 100 therebetween. The second substrate 300 may include filter portions 300R, 300G, and 300B to form a color filter unit 20 as shown in FIG. 4. In FIG. 2, a length of the second substrate 300 in a y-direction is less than that of the first substrate 100 to externally expose a terminal 140, but the second substrate 300 may have the same size as that of the first substrate 100 (e.g., when viewed in a plan view).

The display area DA is covered by a thin film encapsulation layer 400 that protects against external air or moisture. The thin film encapsulation layer 400 is integrally formed to correspond to an entire surface of the display area DA and may partially cover the non-display area NDA. The thin film encapsulation layer 400 may partially or entirely cover a first scan driving circuit 120, a second scan driving circuit 130, a data driving circuit 150, a first power supply line 160, and/or a second power supply line 170 that may be described in more detail below.

Each of the pixels P may be encapsulated against external air by the thin film encapsulation layer 400. In other words, each of the pixels P may be encapsulated against or not be exposed to an external environment. Because the organic light-emitting diode OLED is vulnerable to external elements such as moisture, oxygen, etc., the reliability of the display apparatus 1 may be improved by encapsulating the organic light-emitting diode OLED with the thin film encapsulation layer 400. When the display apparatus 1 includes the thin film encapsulation layer 400 as described above, a thickness of the display apparatus 1 may be reduced and the flexibility of the display apparatus 1 may be improved.

Each of the pixels P may be electrically connected to circuits and/or other components arranged in the non-display area NDA. In the non-display area NDA, the first scan driving circuit 120, the second scan driving circuit 130, the terminal 140, the data driving circuit 150, the first power supply line 160, and/or the second power supply line 170 may be arranged.

The first scan driving circuit 120 may provide each pixel P with a scan signal via a scan line SL. The first scan driving circuit 120 may provide each of the pixels P with an emission control signal via an emission control line EL. The second scan driving circuit 130 may be arranged in parallel with the first scan driving circuit 120, with the display area DA therebetween. In one or more embodiments, the second scan driving circuit 130 is arranged opposite to the first scan driving circuit 120 with the display area DA therebetween. Some of the pixels P arranged in the display area DA may be electrically connected to the first scan driving circuit 120, and the other pixels P may be connected to the second scan driving circuit 130. As another embodiment, the second scan driving circuit 130 may be omitted. For example, pixels P may be connected to only a single scan driving circuit (e.g., the first scan driving circuit 120).

The terminal 140 may be arranged at a side of the first substrate 100. The terminal 140 may not be covered by an insulating layer and may be exposed for an electrical connection. In one or more embodiments, the terminal 140 may be electrically connected to a printed circuit board PCB. A terminal PCB-P of the printed circuit board PCB may be electrically connected to the terminal 140 of the display apparatus 1. The printed circuit board PCB transfers a signal or power from a controller to the display apparatus 1.

A control signal generated by the controller may be respectively transferred to the first and second scan driving circuits 120 and 130 via the printed circuit board PCB. The controller may provide the first and second power supply lines 160 and 170 respectively with a first power voltage ELVDD and a second power voltage and ELVSS via first and second connecting lines 161 and 171. The first power voltage ELVDD is supplied to each pixel P via a driving voltage line PL connected to the first power supply line 160, and the second power voltage ELVSS may be provided to an opposite electrode of each pixel P connected to the second power supply line 170.

The data driving circuit 150 is electrically connected to a data line DL. A data signal of the data driving circuit 150 may be provided to each of the pixels P via a connecting line 151 connected to the terminal 140 and the data line DL connected to the connecting line 151. Although FIG. 2 shows that the data driving circuit 150 is arranged on the printed circuit board PCB, in one or more embodiments, the data driving circuit 150 may be arranged on the first substrate 100. For example, the data driving circuit 150 may be between the terminal 140 and the first power supply line 160.

The first power supply line 160 may include a first sub-line 162 and a second sub-line 163 that extend in parallel with each other in an X-direction with the display area DA therebetween. In one or more embodiments, the first sub-line 162 is opposite to the second sub-line 163 with the display area DA therebetween. The second power supply line 170 may have a loop shape having an opening side such that the loop shape partially surrounds the display area DA as shown in FIG. 2.

Figure 3:
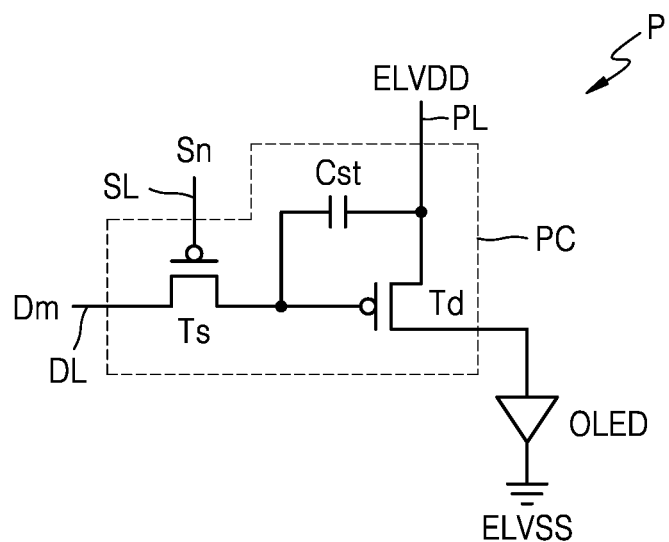
FIG. 3 is an equivalent circuit diagram of a sub-pixel included in a display apparatus according to an embodiment.

FIG. 3 is an equivalent circuit diagram of a sub-pixel included in a display apparatus according to an embodiment.

Referring to FIG. 3, each pixel P includes a pixel circuit PC connected to a scan line SL and a data line DL, and an organic light-emitting diode OLED connected to a pixel circuit PC.

The pixel circuit PC includes a driving thin film transistor Td, a switching thin film transistor Ts, and a storage capacitor Cst. The switching thin film transistor Ts is connected to the scan line SL and the data line DL and transfers a data signal Dm input through the data line DL to the driving thin film transistor Td according to a scan signal Sn input through the scan line SL.

The storage capacitor Cst is connected to the switching thin film transistor Ts and a driving voltage line PL and stores a voltage corresponding to a difference between a voltage transferred from the switching thin film transistor Ts and the first power voltage ELVDD (or driving voltage) supplied to the driving voltage line PL.

The driving thin film transistor Td is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a set (e.g., predetermined) luminance according to the driving current.

FIG. 3 shows an example in which the pixel circuit PC includes two thin film transistors and one storage capacitor, but one or more embodiments are not limited thereto. In another embodiment, the pixel circuit PC may include seven thin film transistors and one storage capacitor. In another embodiment, the pixel circuit PC may include two or more storage capacitors.

Figure 5:
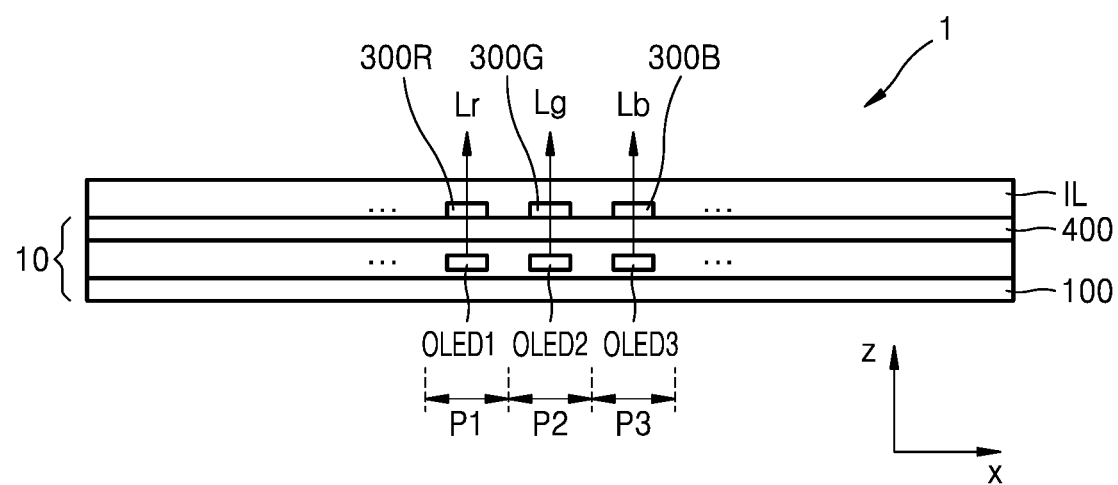

FIGS. 4 and 5 are cross-sectional views of the display apparatus 1 according to an embodiment.

Referring to FIG. 4, the display apparatus 1 includes a display unit 10 and a color filter unit 20 facing the display unit 10. The display unit 10 may include a first pixel P1, a second pixel P2, and a third pixel P3 on the first substrate 100. The first pixel P1, the second pixel P2, and the third pixel P3 may respectively emit different color light from one another on the first substrate 100. For example, the first pixel P1 may emit red light Lr, the second pixel P2 may emit green light Lg, and the third pixel P3 may emit blue light Lb.

The first pixel P1, the second pixel P2, and the third pixel P3 may respectively include a first display element OLED1, a second display element OLED2, and a third display element OLED3 each including an organic light-emitting diode OLED. In one or more embodiments, the first display element OLED1, the second display element OLED2, and the third display element OLED3 may emit blue light.

The color filter unit 20 may include first to third filter portions (e.g., first filter portion 300R, second filter portion 300G, and third filter portion 300B). Light emitted from the first display element OLED1, the second display element OLED2, and the third display element OLED3 may respectively become red light Lr, green light Lg, and blue light Lb after passing through the filter portions 300R, 300G, and 300B.

The filter portions 300R, 300G, and 300B may be directly on the second substrate 300. Here, "directly on the second substrate 300" may denote that the filter portions 300R, 300G, and 300B are directly formed on the second substrate 300 to manufacture the color filter unit 20. In one or more embodiments, the filter portions 300R, 300G, and 300B are integral with the second substrate 300. In one or more embodiments, the display unit 10 and the color filter unit 20 may be bonded to each other by making the filter portions 300R, 300G, and 300B respectively face the first pixel P1, the second pixel P2, and the third pixel P3. FIG. 4 shows that the display unit 10 and the color filter unit 20 are bonded to each other via an adhesive layer 30. The adhesive layer 30 may include, for example, an optical clear adhesive (OCA), but is not limited thereto. In one or more embodiments, the adhesive layer 30 may be omitted.

In another embodiment, the filter portions 300R, 300G, and 300B may be directly on the display unit 10 as shown in FIG. 5. Here, "directly on the display unit 10" may denote that the filter portions 300R, 300G, and 300B are directly formed on the display unit 10 as an integrated structure, without separately manufacturing the color filter unit 20 as shown in FIG. 4.

Here, the filter portions 300R, 300G, and 300B may be on the thin film encapsulation layer 400. In some cases, "other layers" may be between the filter portions 300R, 300G, and 300B and the thin film encapsulation layer 400, and then the filter portions 300R, 300G, and 300B may be on the other layers. For example, "other layers" may include an organic layer, an inorganic layer, a conductive layer, and/or a composite layer thereof.

An insulating layer IL may be on the filter portions 300R, 300G, and 300B.

Figure 6:
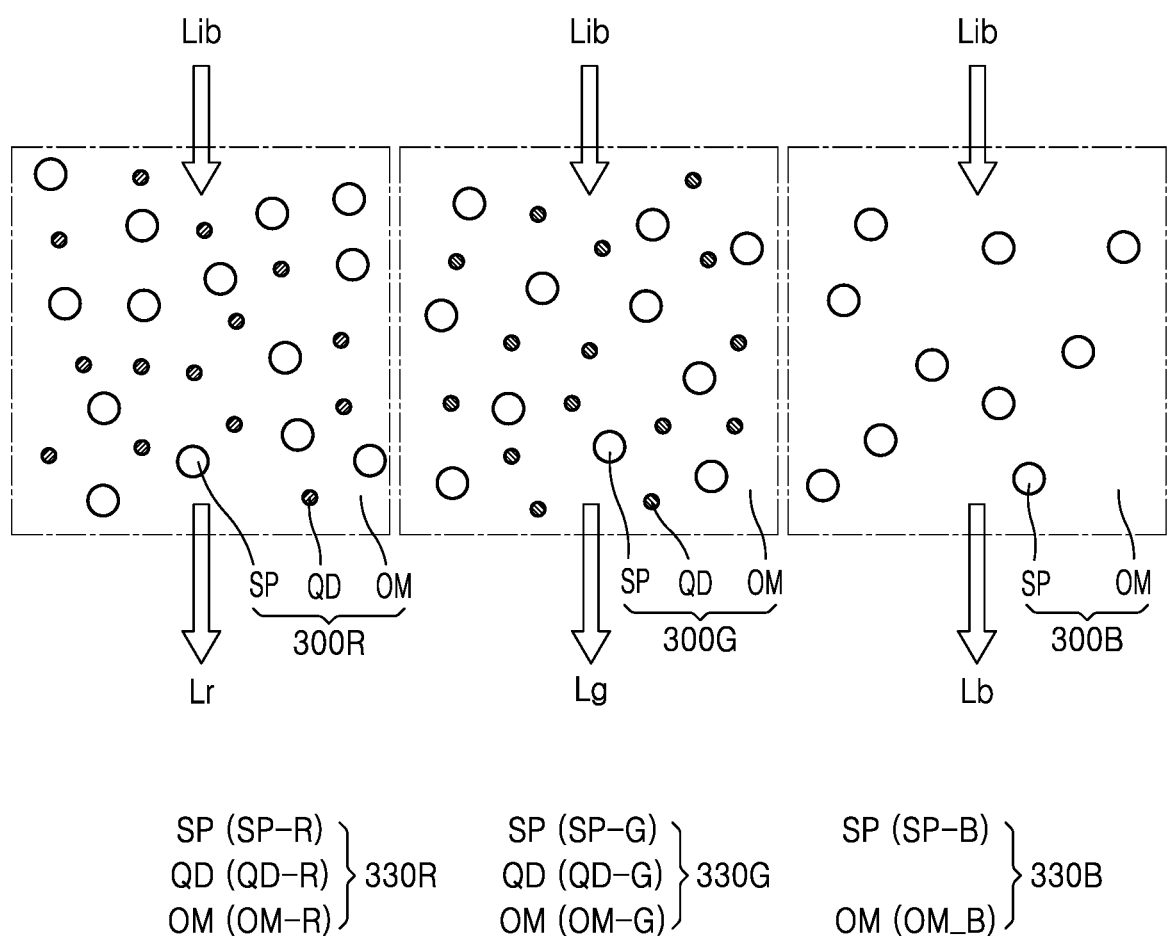
FIG. 6 is an enlarged view of a plurality of filters according to an embodiment.

FIG. 6 is an enlarged view of a plurality of filter portions 300R, 300G, and 300B according to an embodiment.

Referring to FIG. 6, each of the first filter portion 300R, the second filter portion 300G, and the third filter portion 300B may include scattering particles SP and each of the first filter portion 300R and the second filter portion 300G may include quantum dots QD. In an embodiment, the first filter portion 300R and the second filter portion 300G may respectively include quantum dots QD-R and QD-G. Also, the first filter portion 300R, the second filter portion 300G, and the third filter portion 300B may respectively include scattering particles SP-R, SP-G, and SP-B. In an embodiment, each of the quantum dots QD-R and QD-G shown in FIG. 6 may be one of first and second quantum dots QD1 and QD2 shown in FIG. 7, and each of the scattering particles SP-R, SP-G, and SP-B shown in FIG. 6 may be one of first to third scattering particles (e.g., first scattering particles SP1, second scattering particles SP2, and third scattering particles SP3) shown in FIG. 7. Although the embodiment of FIG. 6 depicts the third filter portion 300B as not including quantum dots QD, in one or more embodiments, the third filter portion 300B may include quantum dots QD.

The first filter portion 300R of FIG. 6 may correspond to a first color conversion layer 320R or a first light scattering layer 330R that may be described in more detail below with reference to FIG. 7, the second filter portion 300G may correspond to a second color conversion layer 320G or a second light scattering layer 330G that may be described in more detail below with reference to FIG. 7, and the third filter portion 300B may correspond to a first transmission layer 330B or a second transmission layer 320B that may be described in more detail below with reference to FIG. 7.

The first filter portion 300R may transform blue incident light Lib into first color light Lr (e.g., red light Lr). The first filter portion 300R may include a photosensitive polymer OM-R in which the quantum dots QD-R and the scattering particles SP-R are dispersed.

The quantum dots QD-R of the first filter portion 300R are excited by the blue incident light Lib and may isotropically emit the first color light Lr (e.g., a red light) having a longer wavelength than that of the blue light. The photosensitive polymer OM-R may include an organic material transmitting light. The scattering particles SP-R scatters the blue incident light Lib that is not absorbed by the quantum dots QD-R to excite more quantum dots QD-R, and accordingly, a color conversion ratio of the first filter portion 300R may be increased. The scattering particles SP-R may include, for example, titanium oxide ($TiO_2$) and/or metal particles.

A core of a quantum dot may be selected from a Group II-VI compound, a Group III-V compound, a Group IV-VI compound, a Group IV element, a Group IV compound, and a combination thereof.

The Group II-VI compound may be selected from the group consisting of: CdSe, CdTe, ZnS, ZnSe, ZnTe, ZnO, HgS, HgSe, HgTe, MgSe, MgS, and a binary compound selected from a group formed by mixtures thereof; AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a ternary compound selected from a group formed by mixtures thereof; and HgZnTeS, CdZnSeS, CdZnSeTe, CdZnSTe, CdHgSeS, CdHgSeTe, CdHgSTe, HgZnSeS, HgZnSeTe, HgZnSTe, and a quaternary compound selected from a group formed by mixtures thereof.

The Group III-V compound may be selected from the group consisting of: GaN, GaP, GaAs, GaSb, AlN, AlP, AlAs, AlSb, InN, InP, InAs, InSb and a binary compound selected from a group formed by mixtures thereof; GaNP, GaNAs, GaNSb, GaPAs, GaPSb, AlNP, AlNAs, AlNSb, AlPAs, AlPSb, InGaP, InNAs, InNP, InNAs, InNSb, InPAs, InPSb, GaAlNP, and a ternary compound selected from a group formed by mixtures thereof; and GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a quaternary compound selected from a group formed by mixtures thereof.

The Group IV-VI compound may be selected from the group consisting of: SnS, SnSe, SnTe, PbS, PbSe, PbTe, and a binary compound selected from a group formed by mixtures thereof; SnSeS, SnSeTe, SnSTe, PbSeS, PbSeTe, PbSTe, SnPbS, SnPbSe, SnPbTe, and a ternary compound selected from a group formed by mixtures thereof; and SnPbSSe, SnPbSeTe, SnPbSTe, and a quaternary compound selected from a group formed by mixtures thereof. The Group IV element may be selected from the group consisting of Si, Ge, and mixtures thereof. The Group IV compound may include a binary compound selected from the group consisting of SiC, SiGe, and mixtures thereof.

Here, the binary compound, the ternary compound, or the quaternary compound may be present in the particles in a uniform or substantially uniform concentration, or may be present in the same particle with partially different concentration distributions. Also, the quantum dot may have a core-shell structure, in which one quantum dot surrounds another quantum dot. An interface between the core and the shell may have a concentration gradient in which a concentration of an element in the shell decreases towards a center of core.

In some embodiments, the quantum dot may have the core-shell structure including a core having a nano-crystal described above and a shell surrounding the core. The shell of the quantum dot may act as a protective layer for preventing or reducing chemical modification of the core and maintaining semiconductor characteristics and/or a charging layer for applying an electrophoretic characteristic to the quantum dot. The shell may have a single-layer structure or a multi-layer structure. An interface between the core and the shell may have a concentration gradient in which a concentration of an element in the shell decreases towards a center of the quantum dot. The shell of the quantum dot may include oxide of a metal or non-metal material, a semiconductor compound, or a combination thereof.

For example, the oxide of the metal or non-metal material may include, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc., and/or a ternary compound such as $MgAl_2O_4$, $CoFe_2O_4$, $NiFe_2O_4$, $CoMn_2O_4$, etc.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but is not limited thereto.

The quantum dot may have a full width at half maximum (FWHM) of the light emitting wavelength spectrum of about 45 nm or less, for example, about 40 nm or less, in particular, about 30 nm or less, and may improve color purity or color reproduction within the above range. Also, the light emitted from the quantum dot is omni-directional, and thus, an optical viewing angle may be increased.

The quantum dot may have any suitable shape and is not limited to any particular shape, for example, the quantum dot may be a spherical, pyramidal, multi-arm, or a cubic nanoparticle, or may be a nanotube, nanowire, nanofiber, nanoplate particle, etc.

The quantum dot may adjust a color of emitting light according to a particle size thereof, and accordingly the quantum dot may emit various color light, (e.g., blue light, red light, green light, etc).

The second filter portion 300G may convert the blue incident light Lib into second color light Lg (e.g., green light Lg). The second filter portion 300G may include a photosensitive polymer OM-G in which the quantum dots QD-G and the scattering particles SP-G are dispersed.

The quantum dots QD-G are excited by the blue incident light Lib and may isotropically emit second color light Lg (e.g., a green light) having a longer wavelength than that of the blue light. The photosensitive polymer OM-G includes an organic material transmitting light and may be the same as the above-described photosensitive polymer OM-R.

The scattering particles SP-G scatter the blue incident light Lib that is not absorbed by the quantum dots QD-G to excite more quantum dots QD-G, and accordingly, a color conversion ratio of the second filter portion 300G may be increased. The scattering particles SP-G of the second filter portion 300G may include, for example, titanium oxide ($TiO_2$) and/or metal particles and may be the same as the scattering particles SP-R of the first filter portion 300R. The quantum dots QD-G may be selected from a Group II-VI compound, a Group III-V compound, a Group IV-VI compound, a Group IV element, a Group IV compound, and a combination thereof. The quantum dots QD-G may be the same as the quantum dots QD-R, and the quantum dots QD-G may have the same size as that of the quantum dots QD-R, but one or more embodiments of the present disclosure are not limited thereto. In another embodiment, the quantum dots QD-G may have a size less than that of the quantum dots QD-R.

The third filter portion 300B transmits the blue incident light Lib and emits the blue incident light Lib towards the second substrate 300. The third filter portion 300B may include a photosensitive polymer OM-B in which scattering particles SP-B are dispersed. The photosensitive polymer OM-B may include, for example, an organic material having light transmittance such as a silicon resin, an epoxy resin, etc. and may be the same as the photosensitive polymers OM-R and OM-G. The scattering particles SP-B may scatter and emit the blue incident light Lib and may include the same material as those of the scattering particles SP-R and SP-G.

Figure 7:
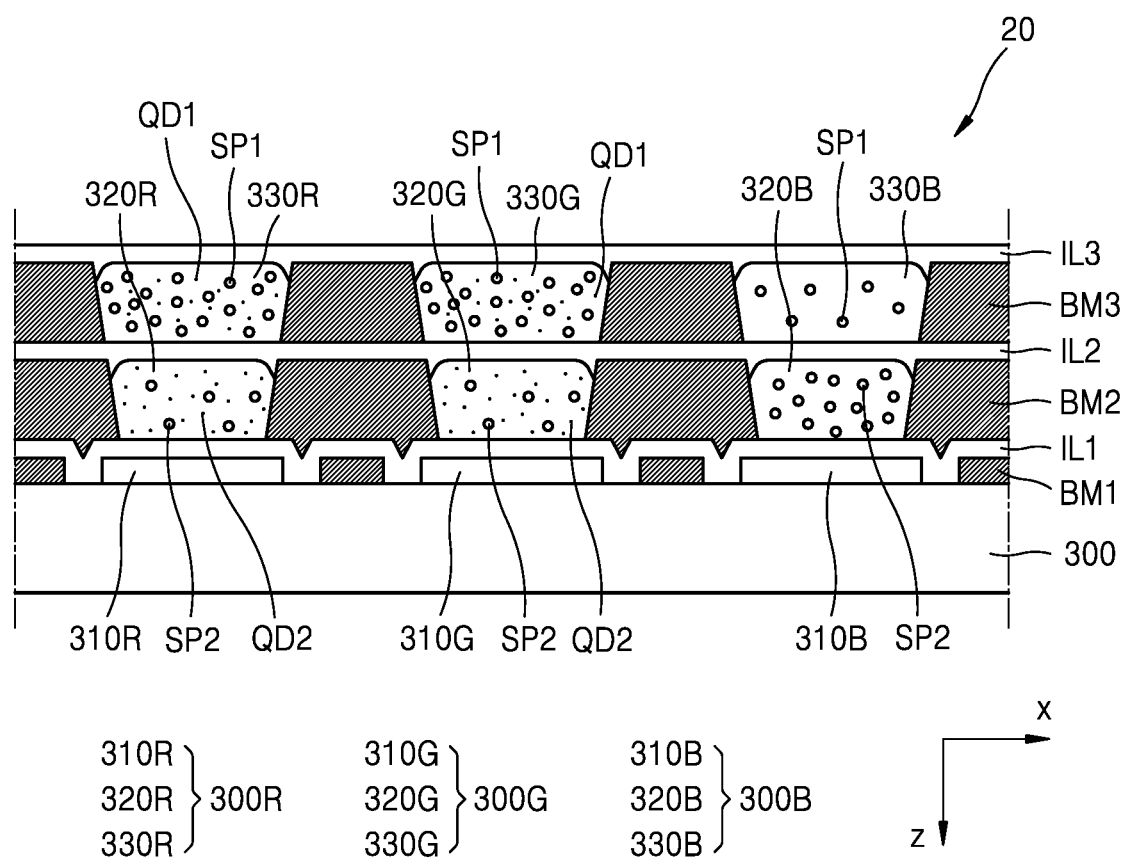
FIG. 7 is a cross-sectional view of a color filter unit according to an embodiment.
Figure 8:
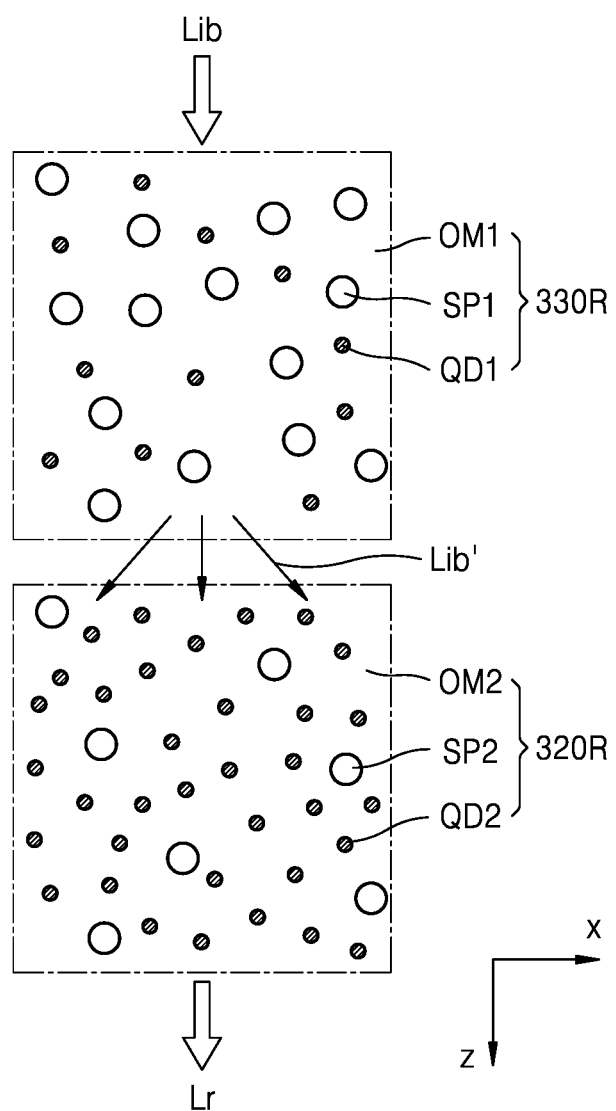
FIG. 8 is an enlarged view of a first filter of FIG. 7.

FIG. 7 is a cross-sectional view of the color filter unit 20 according to the embodiment, and FIG. 8 is an enlarged view of the first filter portion of FIG. 7.

Figure 14:
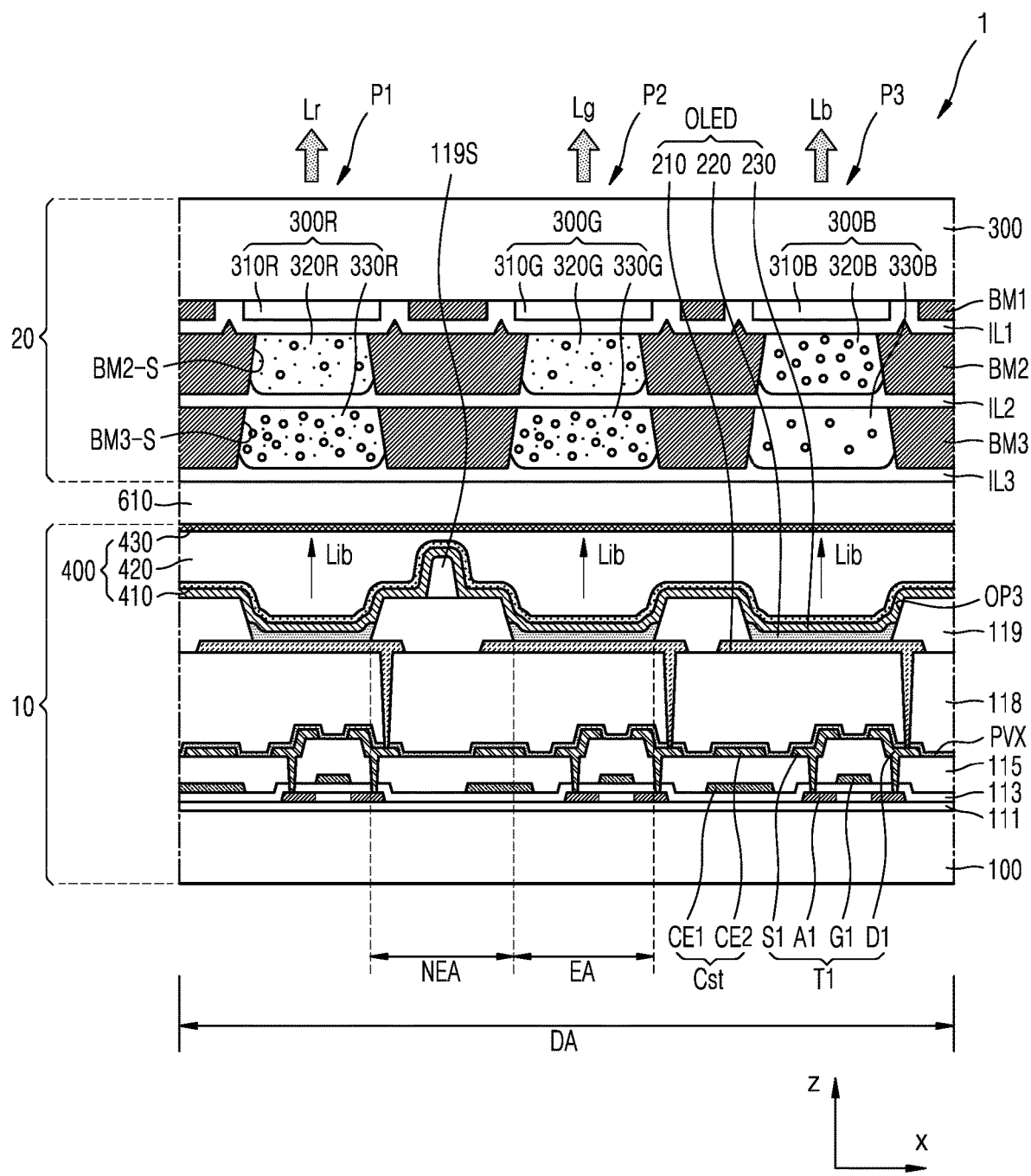
FIGS. 14 and 15 are cross-sectional views of a display apparatus according to an embodiment.

Referring to FIG. 7, the color filter unit 20 includes elements on the second substrate 300. In the description below with reference to FIG. 7, the elements are described on the second substrate 300, but actually the color filter unit 20 is turned upside down so that the second substrate 300 is located at an uppermost portion as shown in FIG. 14. In FIG. 7, the color filter unit 20 may be described in a manufacturing order of the color filter unit 20. Therefore, in the description with reference to FIG. 7, when "layer B" is on "layer A", may actually denote that "layer B" is below "layer A" in the display apparatus 1.

The first filter portion 300R, the second filter portion 300G, and the third filter portion 300B of the color filter unit 20 may be on the second substrate 300. The first filter portion 300R includes a first color filter 310R, the first color conversion layer 320R, and the first light scattering layer 330R. The second filter portion 300G includes a second color filter 310G, the second color conversion layer 320G, and the second light scattering layer 330G. The third filter portion 300B includes a third color filter 310B, the first transmission layer 330B, and the second transmission layer 320B.

The color filter unit 20 may include the first color filter 310R, the second color filter 310G, and the third color filter 310B on the second substrate 300. The first color filter 310R, the second color filter 310G, and the third color filter 310B may be spaced apart from one another by a space that is a non-emitting area NEA (e.g., see FIG. 14), and a first light blocking layer BM1 may be in the space. In one or more embodiments, a plurality of first light blocking layers BM1 may be in the non-emitting area NEA as shown in FIG. 7. In one or more embodiments, a plurality of first light blocking layers in the cross-sectional view may refer to sections of a single, monolithic first light blocking layer or sections of separate first light blocking layers spaced apart from each other in a plan view.

A first inorganic insulating layer IL1 may be on the first light blocking layer BM1. The first inorganic insulating layer IL1 may cover the first color filter 310R, the second color filter 310G, the third color filter 310B, and the first light blocking layer BM1.

A second light blocking layer BM2 corresponding to the first light blocking layer BM1 may be on the first inorganic insulating layer IL1. That is, the second light blocking layer BM2 may be patterned to correspond to the non-emitting area NEA. A region where the second light blocking layer BM2 is not arranged may be understood as an emitting area EA (e.g., see FIG. 14).

A plurality of second light blocking layers BM2 may be spaced apart from one another, and the first color conversion layer 320R, the second color conversion layer 320G, and the second transmission layer 320B are each arranged between the second light blocking layers BM2. In one or more embodiments, a plurality of second light blocking layers in the cross-sectional view may refer to sections of a single, monolithic second light blocking layer or sections of separate second light blocking layers spaced apart from each other in a plan view. The first color conversion layer 320R, the second color conversion layer 320G, and the second transmission layer 320B may be obtained or formed by, for example, an inkjet printing method, but one or more embodiments are not limited thereto. The first color conversion layer 320R, the second color conversion layer 320G, and the second transmission layer 320B may be on the first inorganic insulating layer IL1. The first color conversion layer 320R corresponds to the first color filter 310R, the second color conversion layer 320G corresponds to the second color filter 310G, and the second transmission layer 320B corresponds to the third color filter 310B.

A second inorganic insulating layer IL2 may be on the second light blocking layers BM2. The second inorganic insulating layer IL2 may cover the first color conversion layer 320R, the second color conversion layer 320G, and the second transmission layer 320B.

A third light blocking layer BM3 corresponding to the second light blocking layer BM2 may be on the second inorganic insulating layer IL2. That is, the third light blocking layer BM3 may be patterned to correspond to the non-emitting area NEA. A region where the third light blocking layer BM3 is not arranged may be understood as an emitting area EA (e.g., see FIG. 14).

The first light scattering layer 330R, the second light scattering layer 330G, and the first transmission layer 330B may be arranged among (e.g., on the same layer as) a plurality of third light blocking layers BM3. In one or more embodiments, a plurality of third light blocking layers in the cross-sectional view may refer to sections of a single, monolithic third light blocking layer or sections of separate third light blocking layers spaced apart from each other in a plan view. The first light scattering layer 330R, the second light scattering layer 330G, and the first transmission layer 330B may be obtained or formed by, for example, an inkjet printing method, but one or more embodiments are not limited thereto. The first light scattering layer 330R may correspond to the first color filter 310R, the second light scattering layer 330G may correspond to the second color filter 310G, and the first transmission layer 330B may correspond to the third color filter 310B.

A third inorganic insulating layer IL3 may be on the third light blocking layers BM3. For example, the third inorganic insulating layer IL3 may cover the first light scattering layer 330R, the second light scattering layer 330G, and the first transmission layer 330B. As described above, in the display apparatus 1 including the color filter unit 20, the third inorganic insulating layer IL3 may be closest to the organic light-emitting diode OLED (e.g., see FIG. 14).

In one or more embodiments, the first and second light scattering layers 330R and 330G may include the first quantum dots QD1 and the first scattering particles SP1, and the first and second color conversion layers 320R and 320G may include the second quantum dots QD2 and the second scattering particles SP2.

Here, a concentration of the first scattering particles SP1 in the first light scattering layer 330R may be greater than a concentration of the second scattering particles SP2 included in the first color conversion layer 320R. The number of first scattering particles SP1 per unit volume is greater than the number of second scattering particles SP2 per unit volume when the concentration of the first scattering particles SP1 is greater than that of the second scattering particles SP2. That is, an amount of the first scattering particles SP1 per unit volume in the first light scattering layer 330R may be greater than an amount of the second scattering particles SP2 per unit volume in the first color conversion layer 320R.

In one or more embodiments, the concentration of the first scattering particles SP1 in the first light scattering layer 330R may be equal to, substantially equal to, or greater than twice the concentration of the second scattering particles SP2 in the first color conversion layer 320R. Accordingly, the above concentration gradient may be provided to concentrate the light scattering effect on the first light scattering layer 330R and to improve the light transmittance. For example, the first scattering particles SP1 may be included in the first light scattering layer 330R with a maximum of about 40 wt % to about 50 wt %, in one embodiment, the first scattering particles SP1 may be included in the first light scattering layer 330R at about 20 wt % to about 40 wt %. The second scattering particles SP2 may be included in the first color conversion layer 320R at about 1 wt % to about 20 wt %.

Referring to FIG. 8, the blue incident light Lib sequentially passes through the first light scattering layer 330R and the first color conversion layer 320R and is converted into the first color light Lr (e.g., red light Lr). The first light scattering layer 330R may include the first scattering particles SP1, the first quantum dots QD1, and the first photosensitive polymer OM1. The first color conversion layer 320R may include the second scattering particles SP2, the second quantum dots QD2, and the second photosensitive polymer OM2. In one or more embodiments, the first scattering particles SP1 may include the same material as that of the second scattering particles SP2, the first quantum dots QD1 may include the same material as that of the second quantum dots QD2, and the first photosensitive polymer OM1 may include the same material as that of the second photosensitive polymer OM2. Because the blue incident light Lib passes through the first light scattering layer 330R in which the concentration of the first scattering particles SP1 is relatively high, scattering of the blue light occurs. Because the light proceeds straightforward, when the light is scattered by the first scattering particles SP1, more light may excite the first quantum dots QD1 and increase the color conversion ratio. In other words, the first scattering particles SP1 scatter light to provide more light to excite the first quantum dots QD1 thereby increasing the color conversion ratio.

Figure 9:
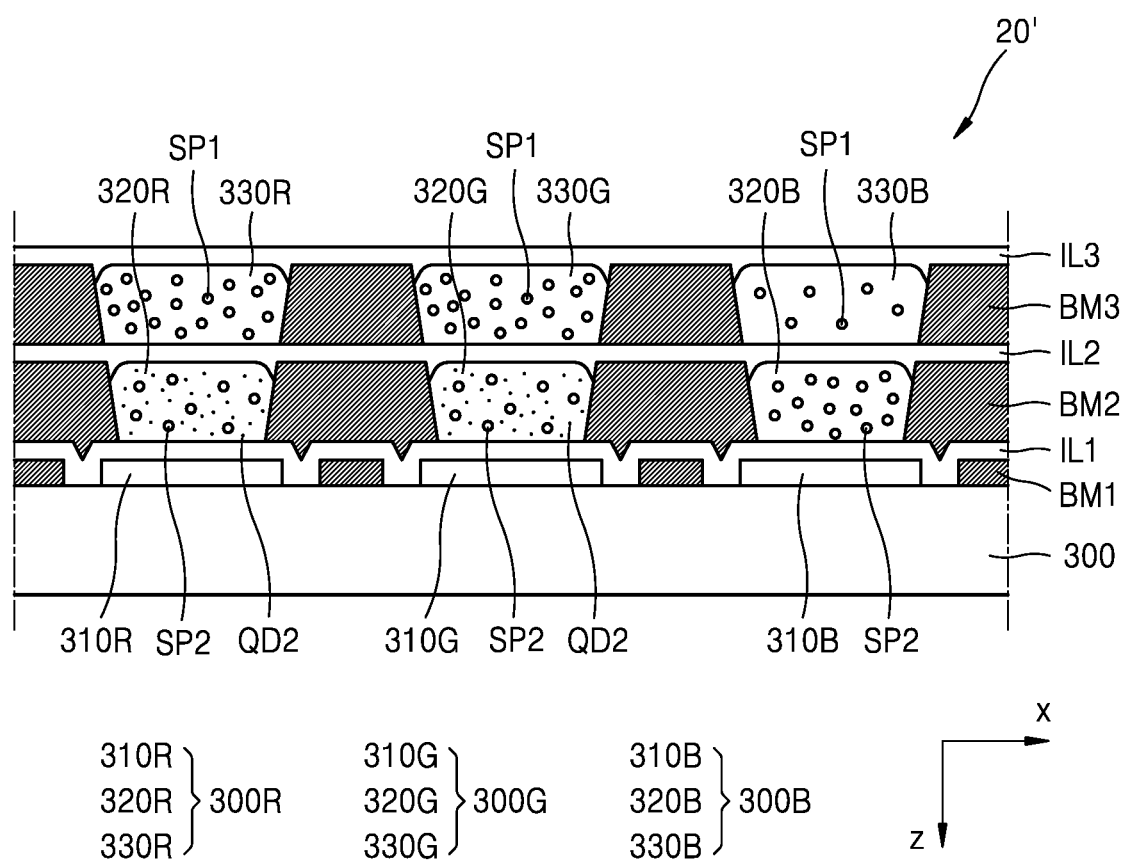
FIG. 9 is a cross-sectional view of a color filter unit according to an embodiment.
Figure 10:
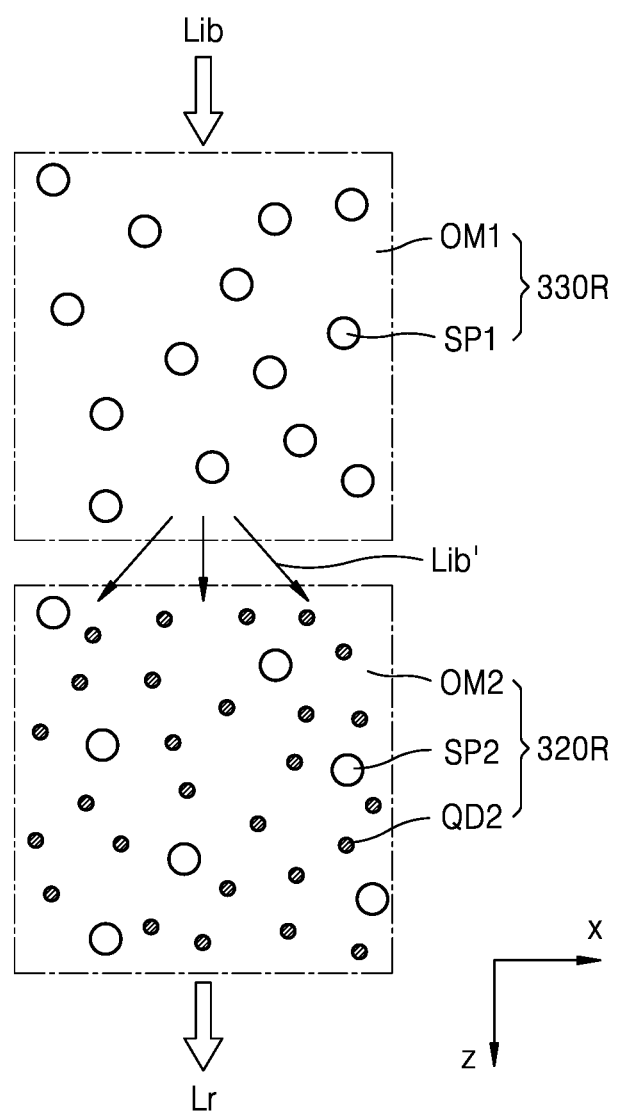
FIG. 10 is an enlarged view of a first filter of FIG. 9.

In some embodiments, the first quantum dots QD1 may be included in the first light scattering layer 330R. Therefore, in the first light scattering layer 330R, the blue incident light Lib may be partially converted into the first color light Lr due to the first quantum dots QD1. However, one or more embodiments of the present disclosure are not limited thereto, for example, the first light scattering layer 330R may not include the first quantum dots QD1 as shown in FIGS. 9 and 10.

Incident light Lib' that is scattered by the first scattering particles SP1 may pass through the first color conversion layer 320R. A concentration of the second quantum dots QD2 included in the first color conversion layer 320R may be greater than a concentration of the first quantum dots QD1 included in the first light scattering layer 330R. The number of second quantum dots QD2 per unit volume may be greater than the number of first quantum dots QD1 per unit volume when the concentration of the first quantum dots QD1 is greater than that of the second quantum dots QD2. That is, an amount of the second quantum dots QD2 per unit volume in the first color conversion layer 320R may be greater than an amount of the first quantum dots QD1 per unit volume in the first light scattering layer 330R.

In one embodiment, the concentration of the second quantum dots QD2 included in the first color conversion layer 320R may be equal to, substantially equal to, or greater than twice the concentration of the first quantum dots QD1 included in the first light scattering layer 330R. Such above concentration gradient may be set so as to concentrate the color conversion effect on the first color conversion layer 320R. For example, the concentration of the second quantum dots QD2 included in the first color conversion layer 320R may be a maximum of about 10 wt %, in one embodiment, the concentration of the second quantum dots QD2 included in the first color conversion layer 320R may be about 5 wt % to about 8 wt %. The first quantum dots QD1 may be included in the first light scattering layer 330R at about 2 wt % to about 4 wt %.

The second quantum dots QD2 included in the first color conversion layer 320R are excited by the incident light Lib' and may isotropically emit the first color light Lr (e.g., a red light) having a longer wavelength than that of the blue light. Because the incident light Lib' is scattered in the first light scattering layer 330R, more light may be absorbed by the second quantum dots QD2 compared to a case in which the blue incident light Lib emitted from the organic light-emitting diode OLED is incident directly to the first color conversion layer 320R without passing through the first light scattering layer 330R. In other words, the blue incident light Lib is incident to (or on) the first color conversion layer 320R after passing through the first light scattering layer 330R according to one or more embodiments, and thus, the color conversion ratio may be further improved.

In some embodiments, the first color conversion layer 320R may also include the second scattering particles SP2. The second scattering particles SP2 included in the first color conversion layer 320R additionally scatter partial incident light (e.g., a part of the incident light) Lib' that is not absorbed by the second quantum dots QD2 in order to excite more second quantum dots QD2 and may increase the color conversion ratio of the first filter portion 300R.

As described above, when the first quantum dots QD1 and the second quantum dots QD2 are excited by the blue incident light Lib and isotropically emit the first color light Lr (e.g., a red light) having a longer wavelength than that of the blue light and the first scattering particles SP1 and the second scattering particles SP2 scatter the blue incident light Lib to excite more first quantum dots QD1 and second quantum dots QD2, the color conversion ratio of the first filter portion 300R may be increased.

However, even in this case, when the amount of the first and second scattering particles SP1 and SP2 included in the first filter portion 300R is excessively increased, the transmittance degrades, and when the amount of the first and second scattering particles SP1 and SP2 decreases, a luminance characteristic according to an angle of the pixel degrades. Also, when the amount of the first and second quantum dots QD1 and QD2 included in the first filter portion 300R increases, manufacturing costs increase and a reflectivity of the pixel degrades.

Therefore, the display apparatus 1 according to one or more embodiments includes the first filter portion 300R corresponding to the first pixel P1 (e.g., see FIG. 4), and the first filter portion 300R has a multi-layer structure, in which the concentration of the first scattering particles SP1 included in the first light scattering layer 330R is greater than that of the second scattering particles SP2 included in the first color conversion layer 320R and the concentration of the first quantum dots QD1 included in the first color conversion layer 320R is greater than that of the second quantum dots QD2 included in the first light scattering layer 330R. As such, the scattering mechanism of the incident light Lib and color conversion mechanism of the scattered incident light Lib' are separated, and thus, the transmittance may be ensured and the color conversion ratio may be effectively improved.

FIG. 8 shows the first filter portion 300R corresponding to the first pixel P1, but the multi-layer structure may be also applied to the second filter portion 300G corresponding to the second pixel P2 (e.g., see FIG. 4). The second filter portion 300G corresponding to the second pixel P2 may also convert the incident light Lib into second color light Lg (e.g., green light Lg) through the same mechanism as that of the first filter portion 300R.

Referring back to FIG. 7, the first transmission layer 330B includes the first scattering particles SP1 and the second transmission layer 320B corresponding to the third pixel P3 (e.g., see FIG. 4) includes the second scattering particles SP2. In one or more embodiments, the concentration of the second scattering particles SP2 included in the second transmission layer 320B may be greater than that of the first scattering particles SP1 included in the first transmission layer 330B. The second transmission layer 320B is adjacent to the second substrate 300, and the blue incident light Lib may sequentially pass through the first transmission layer 330B and the second transmission layer 320B. The blue incident light Lib is partially scattered in the first transmission layer 330B including the first scattering particles SP1 of low concentration, and the majority of the blue incident light Lib may be scattered in the second transmission layer 320B including the second scattering particles SP2 of high concentration. Because the blue incident light Lib is scattered right before being emitted to outside via the second substrate 300, the amount of light emitted through the second substrate 300 may be effectively increased.

FIG. 9 is a cross-sectional view of a color filter unit 20' according to the embodiment, and FIG. 10 is an enlarged view of a first filter portion of FIG. 9.

The embodiment shown in FIG. 9 is the same as the embodiment shown in FIG. 7, except for the first light scattering layer 330R and the second light scattering layer 330G. Hereinafter, differences of the first light scattering layer 330R and the second light scattering layer 330G from those of the above embodiment may be described, and redundant descriptions may be omitted.

Unlike the example shown in FIG. 7, the first light scattering layer 330R and the second light scattering layer 330G of FIG. 9 include the first scattering particles SP1 and do not include quantum dots (e.g., the first quantum dots QD1 of FIG. 7). The first quantum dots QD1 may be only included in the first color conversion layer 320R and the second color conversion layer 320G. Here, a concentration of the first scattering particles SP1 in the first light scattering layer 330R may be greater than a concentration of the second scattering particles SP2 included in the first color conversion layer 320R. In the first light scattering layer 330R including the first scattering particles SP1 and the first color conversion layer 320R including the second scattering particles SP2, the light scattering mechanism of the blue incident light Lib may be similar to that described above with reference to FIG. 8.

Referring to FIG. 10, the first light scattering layer 330R may include the first scattering particles SP1 and the first photosensitive polymer OM1 in which the first scattering particles SP1 are dispersed. While the blue incident light Lib passes through the first light scattering layer 330R in which the concentration of the first scattering particles SP1 is relatively high, scattering of the light occurs. Because the light proceeds straightforward, when the light is scattered by the first scattering particles SP1, more light may excite the second quantum dots QD2 of the first color conversion layer 320R and increase the color conversion ratio. In other words, the first scattering particles SP1 scatter light to provide more light to excite the second quantum dots QD2 thereby increasing the color conversion ratio.

Incident light Lib' that is scattered by the first scattering particles SP1 may pass through the first color conversion layer 320R. Because the second quantum dots QD2 are only included in the first color conversion layer 320R, conversion of the wavelength occurs in the first color conversion layer 320R. The second quantum dots QD2 are excited by the incident light Lib' and may isotropically emit the first color light Lr (e.g., a red light) having a longer wavelength than that of the blue light. Because the incident light Lib' is scattered in the first light scattering layer 330R, more light may be absorbed by the second quantum dots QD2.

Similarly, as shown in FIG. 9, the second light scattering layer 330G of the second filter portion 300G may include the first scattering particles SP1. The second color conversion layer 320G may include the second scattering particles SP2 and the second quantum dots QD2. A concentration of the first scattering particles SP1 in the second light scattering layer 330G may be greater than a concentration of the second scattering particles SP2 included in the second color conversion layer 320G.

FIG. 10 shows the first filter portion 300R corresponding to the first pixel P1, but the second filter portion 300G corresponding to the second pixel P2 may also convert the blue incident light Lib into the second color light Lg through the same color conversion mechanism as that of the first filter portion 300R.

Figure 11:
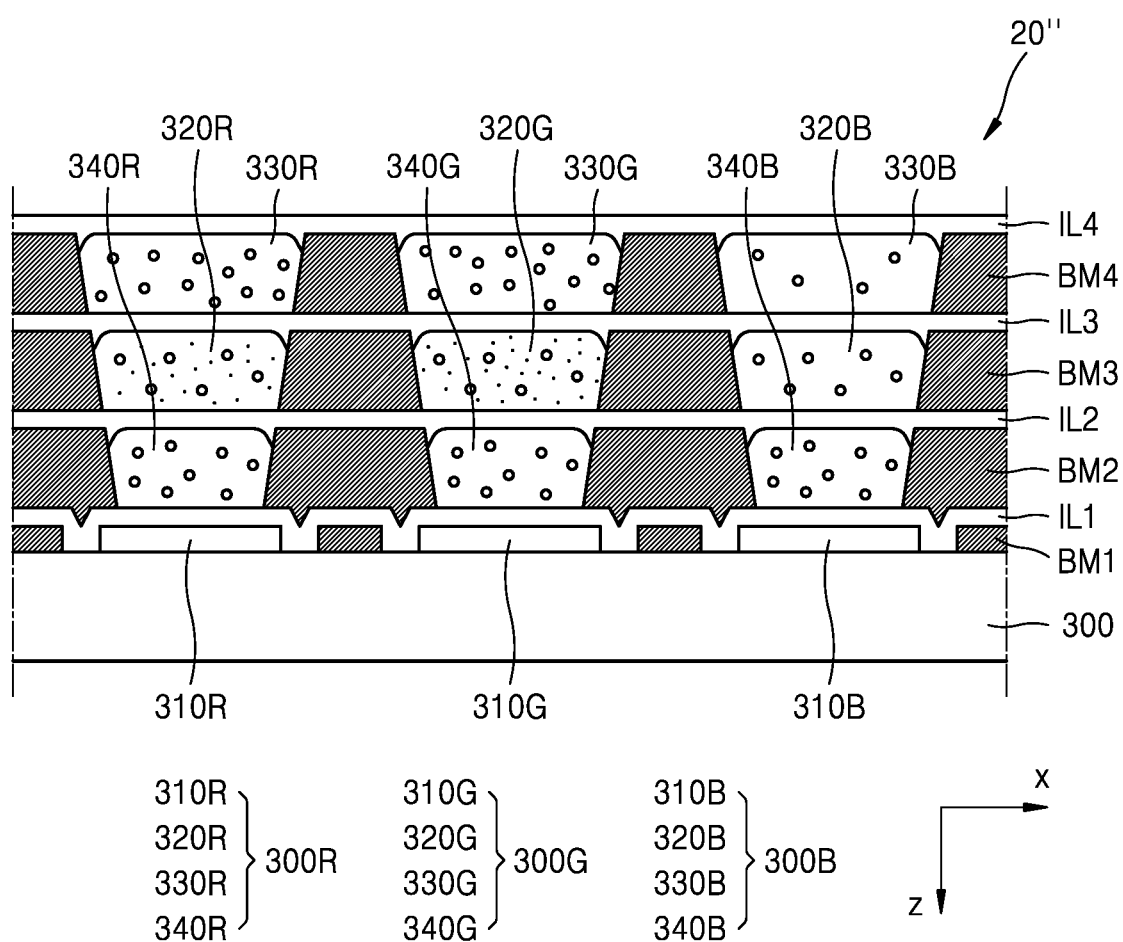
FIGS. 11 and 12 are cross-sectional views of a color filter unit according to an embodiment.
Figure 12:
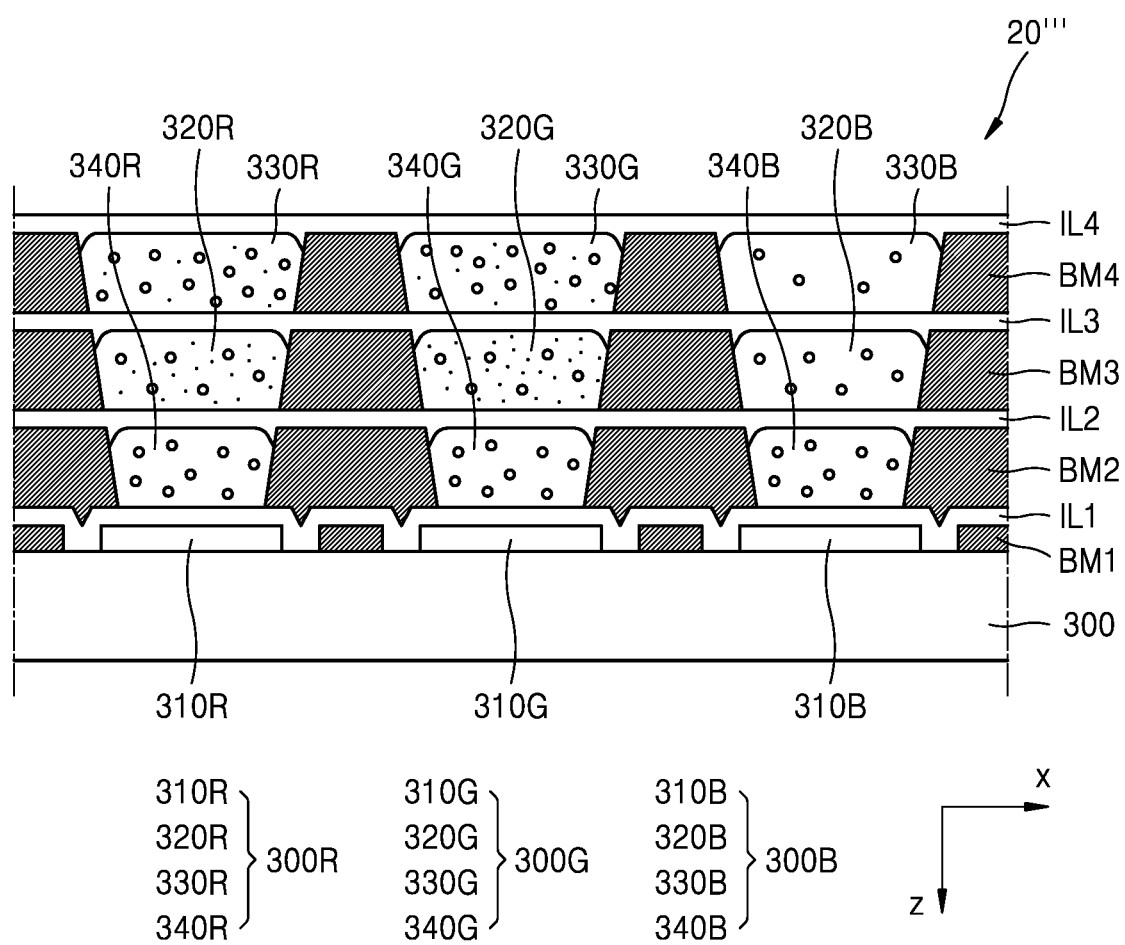
Figure 13:
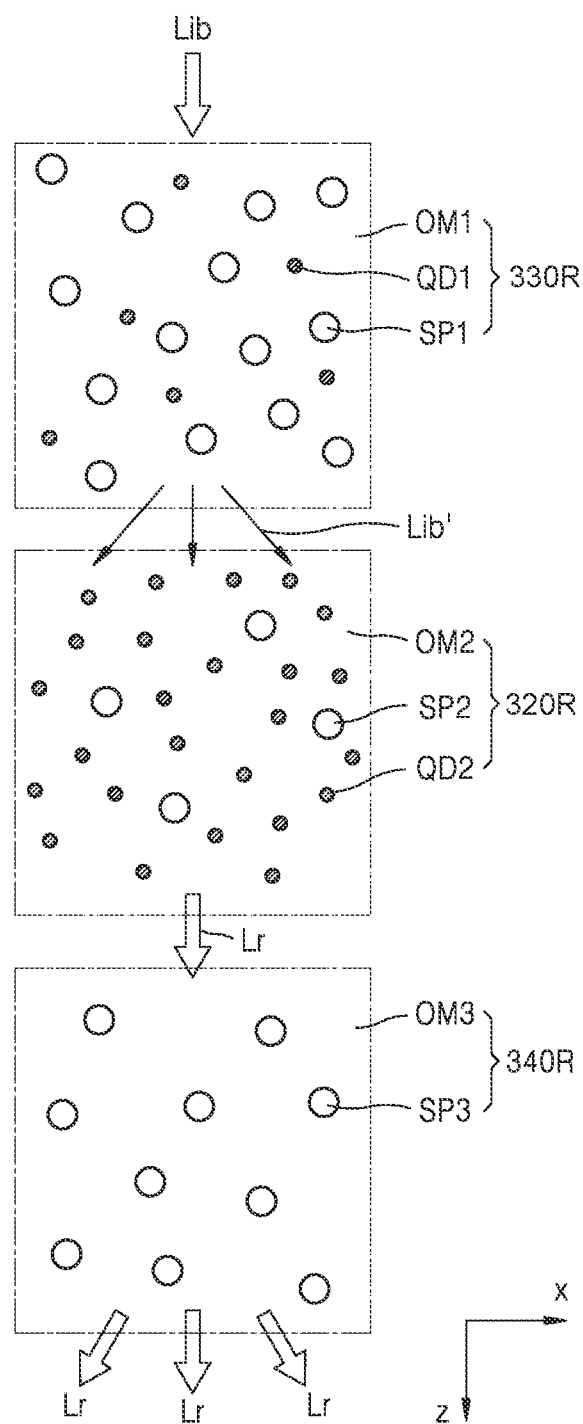
FIG. 13 is an enlarged view of a first filter of FIG. 12.

FIGS. 11 and 12 are cross-sectional views of color filter units 20" and 20'" according to one or more embodiments, and FIG. 13 is an enlarged view of the first filter portion 300R of FIG. 12.

The color filter unit 20" shown in FIG. 11 is similar to the color filter unit 20' according to the embodiment illustrated with reference to FIG. 9, but is different from the color filter unit 20' in view of further including a first light extraction layer 340R, a second light extraction layer 340G, and a third light extraction layer 340B. Hereinafter, the first light extraction layer 340R, the second light extraction layer 340G, and the third light extraction layer 340B may be described, and the same (e.g., redundant) descriptions may be omitted.

Referring to FIG. 11, the color filter unit 20" may include the first color filter 310R, the second color filter 310G, and the third color filter 310B on the second substrate 300. Corresponding to the first color filter 310R, the first light extraction layer 340R, the first color conversion layer 320R, and the first light scattering layer 330R may be sequentially provided in a −Z direction. The first inorganic insulating layer IL1 is between (e.g., in the Z direction) the first color filter 310R and the first light extraction layer 340R, the second inorganic insulating layer IL2 is between (e.g., in the Z direction) the first light extraction layer 340R and the first color conversion layer 320R, a third inorganic insulating layer IL3 is between (e.g., in the Z direction) the first light extraction layer 340R and the first color conversion layer 320R, and a fourth inorganic insulating layer IL4 may be on the first color conversion layer 320R. The first to fourth inorganic insulating layers IL1, IL2, IL3, and IL4 may extend in an X direction.

Similarly, corresponding to the second color filter 310G, the second light extraction layer 340G, the second color conversion layer 320G, and the second light scattering layer 330G may be sequentially provided in the −Z direction. Also, corresponding to the third color filter 310B, the third light extraction layer 340B, the second transmission layer 320B, and the first transmission layer 330B may be sequentially provided in the −Z direction.

The first color filter 310R, the second color filter 310G, and the third color filter 310B are spaced apart from one another by space regions that may include the first light blocking layer BM1. The second light blocking layer BM2, a third light blocking layer BM3, and a fourth light blocking layer BM4 may be sequentially arranged in the −Z direction, corresponding to the first light blocking layer BM1. The second light blocking layer BM2 may be among (e.g., on the same layer as) the first to third light extraction layers (e.g., the first light extraction layer 340R, the second light extraction layer 340G, and the third light extraction layer 340B), the third light blocking layer BM3 may be among (e.g., on the same layer as) the first color conversion layer 320R, the second color conversion layer 320G, and the second transmission layer 320B, and the fourth light blocking layer BM4 may be among (e.g., on the same layer as) the first light scattering layer 330R, the second light scattering layer 330G, and the first transmission layer 330B.

Referring to FIG. 11, the first light extraction layer 340R is between (e.g., in the Z direction) the first color conversion layer 320R and the first color filter 310R, the second light extraction layer 340G is between (e.g., in the Z direction) the second color conversion layer 320G and the second color filter 310G, and the third light extraction layer 340B is between (e.g., in the Z direction) the second transmission layer 320B and the third color filter 310B. That is, the first light extraction layer 340R, the second light extraction layer 340G, and the third light extraction layer 340B are respectively neighboring with (e.g., respectively adjacent to) the first color filter 310R, the second color filter 310G, and the third color filter 310B and may be the layers through which the light incident to the respective first to third color filters (e.g., the first color filter 310R, the second color filter 310G, and the third color filter 310B) passes last (e.g., before passing through the second substrate 300).

The first light extraction layer 340R, the second light extraction layer 340G, and the third light extraction layer 340B may each include third scattering particles SP3. For example, the third scattering particles SP3 may be the same as or different from the first and second scattering particles SP1 and SP2.

As described above, because the first light extraction layer 340R, the second light extraction layer 340G, and the third light extraction layer 340B are the layers through which the light incident to the first to third color filters 310R, 310G, and 310B passes last, when the light is scattered by the first light extraction layer 340R, the second light extraction layer 340G, and the third light extraction layer 340B, a luminance distribution of light emitted from the color filter units 20″ and 20′″ of the pixels may be uniformly or substantially uniformly set.

In one embodiment, concentrations of the third scattering particles SP3 included respectively in the first light extraction layer 340R, the second light extraction layer 340G, and the third light extraction layer 340B may be equal to or substantially equal to one another. However, one or more embodiments are not limited thereto. For example, the concentration of the third scattering particles SP3 may be variously designed in a suitable manner according to the luminance distribution of the pixels. The concentration of the third scattering particles SP3 may be variously set in a suitable manner provided that the luminance distribution of the light emitted from the pixels through the color filter units 20″ and 20′″ is uniform or substantially uniform.

In one or more embodiments, the third scattering particles SP3 included in the first light extraction layer 340R, the second light extraction layer 340G, and the third light extraction layer 340B may all have the same average size. However, one or more embodiments are not limited thereto. For example, the sizes of the third scattering particles SP3 respectively included in the first to third light extraction layers 340R, 340G, and 340B may be different according to the luminance distribution of each pixel.

The embodiment shown in FIG. 12 is the same as the embodiment shown in FIG. 11, except for the first light scattering layer 330R and the second light scattering layer 330G. Hereinafter, differences of the first light scattering layer 330R and the second light scattering layer 330G from those of the above embodiment may be described, and redundant descriptions may be omitted.

Unlike the first light scattering layer 330R of FIG. 11 which only includes the first light scattering particles SP1, the first light scattering layer 330R of FIG. 12 includes the first light scattering particles SP1 and first quantum dots QD1. Some of the first quantum dots QD1 are included in the first light scattering layer 330R, and a wavelength of the blue incident light Lib may be partially changed while the blue incident light Lib is scattered.

Referring to FIG. 13, the blue incident light Lib sequentially passes through the first light scattering layer 330R and the first color conversion layer 320R and is converted into the first color light Lr (e.g., red light Lr).

While the blue incident light Lib passes through the first light scattering layer 330R in which the concentration of the first scattering particles SP1 is relatively high, scattering of the light occurs. Because the light proceeds straightforward, when the light is scattered by the first scattering particles SP1, more light may excite the first quantum dots QD1 and increase the color conversion ratio. In other words, the first scattering particles SP1 scatter light to provide more light to excite the first quantum dots QD1 thereby increasing the color conversion ratio.

In one or more embodiments, the first quantum dots QD1 may be included in the first light scattering layer 330R. Therefore, in the first light scattering layer 330R, the blue incident light Lib may be partially converted into the first color light Lr due to the first quantum dots QD1. However, one or more embodiments are not limited thereto. For example, the first light scattering layer 330R may not include the first quantum dots QD1 as shown in FIG. 11.

Incident light Lib' that is scattered by the first scattering particles SP1 may pass through the first color conversion layer 320R. A concentration of the second quantum dots QD2 included in the first color conversion layer 320R may be greater than a concentration of the first quantum dots QD1 included in the first light scattering layer 330R. That is, an amount of the second quantum dots QD2 per unit volume in the first color conversion layer 320R may be greater than an amount of the first quantum dots QD1 per unit volume in the first light scattering layer 330R.

The second quantum dots QD2 are excited by the incident light Lib' and may isotropically emit the first color light Lr (e.g., a red light) having a longer wavelength than that of the blue light. Because the incident light Lib' is scattered in the first light scattering layer 330R, more light may be absorbed by the second quantum dots QD2.

In one or more embodiments, the first color conversion layer 320R may also include the second scattering particles SP2. The second scattering particles SP2 included in the first color conversion layer 320R additionally scatter partial incident light (e.g., a part of the incident light) Lib' that is not absorbed by the first quantum dots QD1 in order to excite more first quantum dots QD1, and may increase the color conversion ratio of the first filter portion 300R.

As described above, the second quantum dots QD2 are excited by the blue incident light Lib to isotropically emit the first color light Lr (e.g., a red light) having the longer wavelength than that of blue light, and the second scattering particles SP2 scatter the blue incident light Lib to excite more second quantum dots QD2 and to increase the color conversion ratio of the first filter portion 300R.

In addition, when amounts of the first to third scattering particles SP1, SP2, and SP3 in the first filter portion 300R are excessively increased, the transmittance degrades, and when the amount of the first to third scattering particles SP1, SP2, and SP3 decreases, the luminance characteristic of the pixel according to the angle may degrade. Also, because wavelengths of light are different in order for the pixels to emit different colors, the luminance of the light emitted from the pixels may not be made consistent.

Therefore, the color filter unit 20′″ according to one or more embodiments further includes the first light extraction layer 340R, the second light extraction layer 340G, and the third light extraction layer 340B between the first to third color filters 310R, 310G, and 310B and the first and second color conversion layers 320R and 320G and the second transmission layer 320B, and thus, luminance of the light emitted from the pixels to the outside may be consistent.

FIG. 13 shows the first filter portion 300R corresponding to the first pixel P1, but the second filter portion 300G corresponding to the second pixel P2 may also convert the blue incident light Lib into the second color light Lg through the same color conversion mechanism as that of the first filter portion 300R.

Referring back to FIG. 12, the first transmission layer 330B, the second transmission layer 320B, and the third light extraction layer 340B corresponding to the third pixel P3 may respectively include the first to third scattering particles SP1, SP2, and SP3. In one or more embodiments, concentrations of the first to third scattering particles SP1, SP2, and SP3 may gradually increase in a direction in which the light goes (+Z direction). That is, the concentrations of the first to third scattering particles SP1, SP2, and SP3 may increase in an order of the first transmission layer 330B, the second transmission layer 320B, and the third light extraction layer 340B.

Because the third filter portion 300B includes the increasing number of scattering particles in a direction in which the light proceeds, the optical efficiency may be increased.

Figure 15:
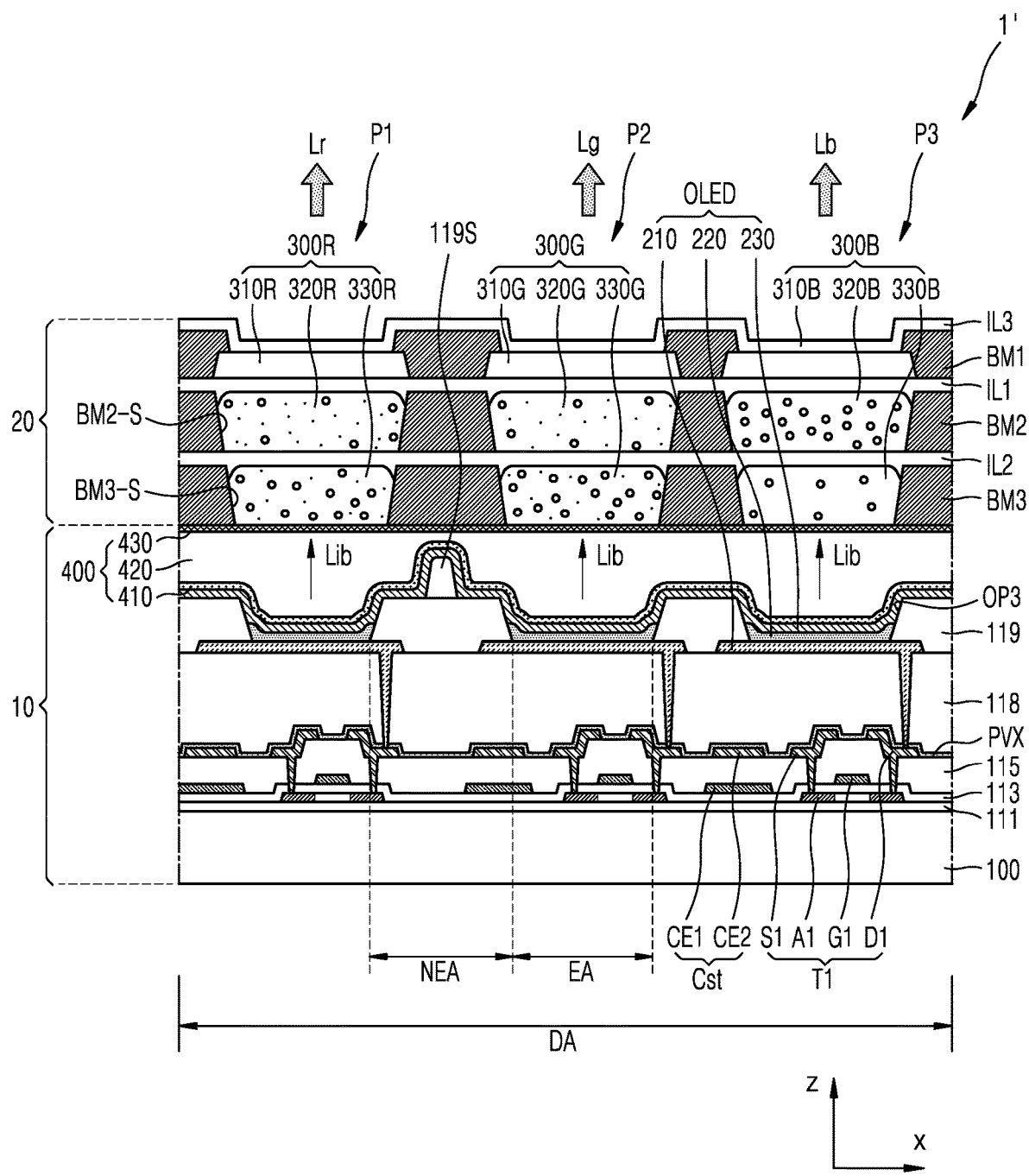

FIGS. 14 and 15 are cross-sectional views of the display apparatuses 1 and 1' according to one or more embodiments. FIG. 14 is a cross-sectional view showing a detailed view of FIG. 4, and FIG. 15 is a cross-sectional view showing a detailed view of FIG. 5.

Referring to FIG. 14, in the display area DA of FIG. 3, a driving thin film transistor T1 and a storage capacitor Cst in the pixel circuit PC of each pixel P described above with reference to FIG. 2 are shown. For convenience of description, elements in the display area DA of FIG. 14 may be described according to a stacking order.

The first substrate 100 may include a glass material, a ceramic material, a metal material, and/or a flexible or bendable material. When the first substrate 100 is flexible or bendable material, the first substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate. The first substrate 100 may have a single-layer or a multi-layer structure of the above material, and the multi-layer structure may further include an inorganic layer.

In one or more embodiments, the first substrate 100 may have a structure including an organic material/an inorganic material/an organic material. For example, the structure may be multi-layer structure including an inorganic material layer between two organic material layers.

A barrier layer may be further provided between the first substrate 100 and the buffer layer 111. The barrier layer may prevent or reduce infiltration of impurities from the first substrate 100, etc. into a semiconductor layer A1. The barrier layer may include an inorganic material such as an oxide material or a nitride material, an organic material, or an inorganic-organic composite material, and may have a single-layer or multi-layer structure including the inorganic material and the organic material.

The semiconductor layer A1 may be on the buffer layer 111. The semiconductor layer A1 may include amorphous silicon or polysilicon. In another embodiment, the semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn). In some embodiments, the semiconductor layer A1 may include Zn oxide-based material, e.g., Zn oxide, In—Zn oxide, Ga—In—Zn oxide, etc. In another embodiment, the semiconductor layer A1 may include In—Ga—Zn—O (IGZO), In—Sn—Zn—O (ITZO), and/or In—Ga—Sn—Zn—O (IGTZO) semiconductor including ZnO with metal such as In, Ga, and Zn. The semiconductor layer A1 may include a channel region, and a source region and a drain region at opposite sides of the channel region. The semiconductor layer A1 may have a single-layer or multi-layer structure.

A gate electrode G1 is over the semiconductor layer A1 with a gate insulating layer 113 therebetween, and the gate electrode G1 at least partially overlaps (e.g., in the Z direction) the semiconductor layer A1. The gate electrode G1 may include molybdenum (Mo), aluminum (Al), copper (Cu), titanium (Ti), etc., and may have a single-layer or multi-layer structure. As an example, the gate electrode G1 may include a single layer including Mo. A first electrode CE1 of the capacitor Cst is at the same layer as the gate electrode G1. The first electrode CE1 may include the same material as that of the gate electrode G1.

An interlayer insulating layer 115 may cover the gate electrode G1 and the first electrode CE1 of the storage capacitor Cst. The interlayer insulating layer 115 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A second electrode CE2 of the storage capacitor Cst, a source electrode S1, a drain electrode D1, and the data line DL may be on the interlayer insulating layer 115.

The second electrode CE2 of the storage capacitor Cst, the source electrode S1, the drain electrode D1, and the data line DL may include a conductive material including Mo, Al, Cu, Ti, etc. and may have a single-layer or multi-layer structure including the above materials. In one embodiment, the second electrode CE2, the source electrode S1, the drain electrode D1, and the data line DL has a multi-layer structure including Ti/Al/Ti. The source electrode S1 and the drain electrode D1 may be connected to the source region or the drain region of the semiconductor layer A1 via contact holes.

The second electrode Ce2 of the storage capacitor Cst overlaps the first electrode CE with the interlayer insulating layer 115 therebetween and forms a capacitance. In this case, the interlayer insulating layer 115 may function as a dielectric layer of the storage capacitor Cst.

The second electrode CE2 of the storage capacitor Cst, the source electrode S1, the drain electrode D1, and the data line DL may be covered by an inorganic protective layer PVX.

The inorganic protective layer PVX may have a single-layer or multi-layer structure including SiNx and SiOx. The inorganic protective layer PVX may be introduced to cover and protect some wirings on the interlayer insulating layer 115. In a partial area of the first substrate 100 (e.g., a part of the peripheral area), wirings manufactured with the data line DL through the same manufacturing process may be exposed. Exposed parts of the wirings may be damaged due to an etchant that is used in patterning of a pixel electrode 310 that may be described in more detail below. However, because the inorganic protective layer PVX according to one or more embodiments at least partially covers the data line DL and the wirings manufactured with the data line DL, damage to the wirings during the patterning of the pixel electrode 310 may be prevented or reduced.

A planarization layer 118 is on the inorganic protective layer PVX and the organic light-emitting diode OLED may be on the planarization layer 118.

The planarization layer 118 may include a single-layer or multi-layer structure including an organic material, and may provide a planarized upper surface. The planarization layer 118 may include a general universal polymer (benzocyclobutene (BCB), polyimide, hexamethyldisiloxane (HMDSO), polymethylmethacrylate (PMMA), and/or polystyrene (PS)), one or more polymer derivatives having phenol groups, acryl-based polymer, imide-based polymer, aryl ether-based polymer, amide-based polymer, fluoride-based polymer, p-xylene-based polymer, and/or vinyl alcohol-based polymer, and/or one or more blends thereof.

In the display area DA of the first substrate 100, the organic light-emitting diode OLED is on the planarization layer 118. The organic light-emitting diode OLED includes the pixel electrode 210, an intermediate layer 220 including an organic light-emitting layer, and an opposite electrode 230.

The pixel electrode 210 may be a (semi-)transmissive electrode or a reflective electrode. In some embodiments, the pixel electrode 210 may include a reflective layer including Ag, Mg, Al, Pt, Pd, Au, Ni, Nd, Ir, Cr, and/or a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide, and aluminum zinc oxide (AZO). In one embodiment, the pixel electrode 210 may include ITO/Ag/ITO.

A pixel defining layer 119 may be on the planarization layer 118, and the pixel defining layer 119 includes an opening corresponding to each of the sub-pixels in the display area DA. For example, a third opening OP3 exposing at least a central portion of the pixel electrode 210 to define a light-emitting region of a pixel. Also, the pixel defining layer 119 increases a distance between an edge of the pixel electrode 210 and the opposite electrode 230 on the pixel electrode 210 to prevent or reduce generation of an arc at the edge of the pixel electrode 210.

The pixel defining layer 119 may include one or more organic insulating materials selected from the group consisting of polyimide, polyamide, acryl resin, BCB, and phenol resin, and may be manufactured by a spin coating method, etc.

The intermediate layer 220 of the organic light-emitting diode OLED may include an organic light-emitting layer. The organic light-emitting layer may include an organic material including a fluorescent or phosphor material emitting red, green, blue, or white light. The organic light-emitting layer may include a low-molecular organic material or a polymer organic material, and functional layers such as a hole transport layer (HTL), a hole injection layer (HIL), an electron transport layer (ETL), and an electron injection layer (EIL) may be selectively arranged under and on the organic light-emitting layer. The intermediate layer 220 may correspond to each of a plurality of pixel electrodes 210. However, one or more embodiments are not limited thereto. The intermediate layer 220 may be variously modified in a suitable manner. For example, the intermediate layer 220 may be arranged in suitable ways throughout the plurality of pixel electrodes 210.

In the drawings, the intermediate layer 220 is provided for each of the first to third pixels (e.g., the first pixel P1, the second pixel P2, and the third pixel P3), but one or more embodiments are not limited thereto. The intermediate layer 320 may be integrally formed with respect to the first to third pixels P1, P2, and P3.

In one or more embodiments, the organic light-emitting diodes OLED included in the first to third pixels P1, P2, and P3 may include the organic light-emitting layers emitting the same color light. For example, the organic light-emitting diodes OLED included in the first to third pixels P1, P2, and P3 may all emit blue light.

The opposite electrode 230 may be a transmissive electrode or a reflective electrode. In some embodiments, the opposite electrode 230 may be a transparent or a semi-transparent electrode, and may be provided as a metal thin film including Li, Ca, LiF/Ca, LiF/Al, A1, Ag, Mg, and/or a compound thereof having a small work function. Also, a transparent conductive oxide (TCO) such as ITO, IZO, ZnO, or $In_2O_3$ may be further provided over the metal thin film. The opposite electrode 230 is arranged throughout the display area DA and a peripheral area PA, and on the intermediate layer 220 and the pixel defining layer 119. The opposite electrode 330 may be provided integrally with respect to the plurality of organic light-emitting diodes OLED to correspond to the plurality of pixel electrodes 310.

A spacer 119S may be further provided on the pixel defining layer 119 for preventing or reducing a mask dent. The spacer 119S may be integrally manufactured with the pixel defining layer 119. For example, the spacer 119S and the pixel defining layer 119 may be manufactured concurrently (e.g., simultaneously) in the same process by using a halftone mask process.

Because the organic light-emitting diode OLED is easily damaged by external moisture or oxygen, the organic light-emitting diode OLED may be covered and protected by a thin film encapsulation layer 400. The thin film encapsulation layer 400 covers the display area DA and may extend to the outside of the display area DA. The thin film encapsulation layer 400 includes at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430.

The first inorganic encapsulation layer 410 covers the opposite electrode 230 and may include silicon oxide, silicon nitride, and/or silicon trioxynitride. In one or more embodiments, other layers such as a capping layer may be provided between the first inorganic encapsulation layer 410 and the opposite electrode 230. Because the first inorganic encapsulation layer 410 is formed along a structure thereunder, the first inorganic encapsulation layer 410 has an uneven upper surface. The organic encapsulation layer 420 covers the first inorganic encapsulation layer 410, and unlike the first inorganic encapsulation layer 410, the organic encapsulation layer 420 may have a flat upper surface. Therefore, the organic encapsulation layer 420 may planarize the upper surface of a portion corresponding to the display area DA. The organic encapsulation layer 420 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 430 may cover the organic encapsulation layer 420, and may include silicon oxide, silicon nitride, and/or silicon trioxynitride.

Even when cracks occur in the thin film encapsulation layer 400, the cracks may be disconnected between the first inorganic encapsulation layer 410 and the organic encapsulation layer 420 or between the organic encapsulation layer 420 and the second inorganic encapsulation layer 430 owing to the multi-layer structure in the thin film encapsulation layer 400. As such, generation of an infiltration path through which the external moisture or oxygen passes to the display area DA may be prevented or reduced.

In one or more embodiments, the color filter unit 20 may face the first substrate 100. The color filter unit 20 shown in FIG. 14 is the same as that of FIG. 7.

A filler 610 may be between the display unit 10 and the color filter unit 20. The filler 610 may buffer external pressure, etc. The filler 610 may include an organic material such as methyl silicone, phenyl silicone, polyimide, etc. However, one or more embodiments are not limited thereto.

For example, the filler 610 may include an organic sealant such as a urethane-based resin, or an epoxy-based resin, an acryl-based resin, and/or an inorganic sealant such as silicone.

The color filter unit 20 of FIG. 14 has a shape obtained by turning over the color filter unit 20 of FIG. 7 (e.g., as shown in FIG. 14). That is, the display apparatus 1 has a shape, in which the color filter unit 20 is bonded to the display unit 10 after the color filter unit 20 is manufactured on the second substrate 300. Therefore, in the display apparatus 1, side surfaces BM2-S and BM3-S of the second light blocking layer BM2 and the third light blocking layer BM3 may have inversely tapered shapes. In some embodiments, the shape (e.g., inversely tapered shape) of the side surfaces may be also applied to the first light blocking layer BM1.

Referring to FIG. 7 together, with respect to the first pixel P1, the blue incident light Lib emitted from the organic light-emitting diode OLED may sequentially pass through the first light scattering layer 330R, the first color conversion layer 320R, and the first color filter 310R. The blue incident light Lib is guided to be scattered while passing through the first light scattering layer 330R including the first scattering particles SP1 at a high concentration, and is converted to the first color light Lr while passing through the first color conversion layer 320R having the second quantum dots QD2 at a high concentration. Thus, the display apparatus 1 having excellent optical efficiency and color reproduction rate may be implemented.

As described above, the light-emitting mechanism of the first pixel P1 may be also applied to the second pixel P2. The second pixel P2 may convert the blue incident light Lib into the second color light Lg through the same mechanism as that of the first pixel P1.

In addition, with respect to the third pixel P3, the blue incident light Lib emitted from the organic light-emitting diode OLED may sequentially pass through the first transmission layer 330B, the second transmission layer 320B, and the third color filter 310B. The blue incident light Lib is partially scattered in the first transmission layer 330B including the first scattering particles SP1 of low concentration, and the majority of the blue incident light Lib may be scattered in the second transmission layer 320B including the second scattering particles SP2 of high concentration. Because the blue incident light Lib is scattered right before being emitted to outside via the second substrate 300, the amount of light emitted through the second substrate 300 may be effectively increased.

Referring to FIG. 15, structures under the thin film encapsulation layer 400 are the same as those of FIG. 14, but the embodiment of FIG. 15 is different from that of FIG. 14 in that the first to third filter portions 300R, 300G, and 300B are directly on the thin film encapsulation layer 400. Hereinafter, structures of the filter portions 300R, 300G, and 300B on the thin film encapsulation layer 400 may be described, and descriptions that are already provided above (e.g., redundant descriptions) may be omitted.

The third light blocking layer BM3 may be on the second inorganic encapsulation layer 430 of the thin film encapsulation layer 400. The third blocking layer BM3 may correspond to the non-emitting area NEA. The second light blocking layer BM2 is over the third light blocking layer BM3 with the second inorganic insulating layer IL2 therebetween, and the first light blocking layer BM1 is over the second light blocking layer BM2 with the first inorganic insulating layer IL1 therebetween.

The first light blocking layer BM1, the second light blocking layer BM2, and the third light blocking layer BM3 may include, for example, a black matrix, a black pigment, a metal material, etc. In one or more embodiments, the first light blocking layer BM1, the second light blocking layer BM2, and the third light blocking layer BM3 may include a reflective material in order to increase the optical efficiency. In one or more embodiments, the side surfaces BM2-S and BM3-S of the second light blocking layer BM2 and the third light blocking layer BM3 may be tapered. The first light blocking layer BM1 may also include a similar structure as those of the second and third light blocking layers BM2 and BM3. The shapes of the side surfaces BM2-S and BM3-S may be caused or formed when the filter portions 300R, 300G, and 300B are directly manufactured on the thin film encapsulation layer 400. That is, the shapes of the side surfaces BM2-S and BM3-S of the second and third light blocking layers BM2 and BM3 shown in FIG. 15 may be distinguishable from the inversely tapered shapes of the side surfaces BM2-S and BM3-S of the second light blocking layer BM2 and the third light blocking layer BM3 shown in FIG. 14.

The first to third inorganic insulating layers IL1 to IL3 may include an inorganic insulating material having light transmittance. For example, the inorganic insulating layer IL1, the second inorganic insulating layer IL2, and the third inorganic insulating layer IL3 may include a material such as silicon oxide ($SiO_x$), silicon nitride ($SiN_x$), and/or silicon oxynitride (SiON). In one or more embodiments, refractive indices of the first inorganic insulating layer IL1, the second inorganic insulating layer IL2, and the third inorganic insulating layer IL3 may be adjusted to further increase the light extraction effect.

The first light scattering layer 330R, the second light scattering layer 330G, and the first transmission layer 330B may be over the second inorganic encapsulation layer 430. Each of the first light scattering layer 330R, the second light scattering layer 330G, and the first transmission layer 330B may correspond to the emission area EA between the third light blocking layers BM3. The first light scattering layer 330R, the second light scattering layer 330G, and the first transmission layer 330B are the same as the above-described examples.

The second inorganic insulating layer IL2 may cover the first light scattering layer 330R, the second light scattering layer 330G, and the first transmission layer 330B.

The first color conversion layer 320R, the second color conversion layer 320G, and the second transmission layer 320B may be over the second inorganic insulating layer IL2. Each of the first color conversion layer 320R, the second color conversion layer 320G, and the second transmission layer 320B may correspond to the emission area EA between the second light blocking layers BM2. The first color conversion layer 320R, the second color conversion layer 320G, and the second transmission layer 320B are the same as those described above.

The first inorganic insulating layer IL1 may cover the first color conversion layer 320R, the second color conversion layer 320G, and the second transmission layer 320B.

The first color filter 310R, the second color filter 310G, and the third color filter 310B may be over the first inorganic insulating layer IL1. The first color filter 310R may improve the color reproduction rate of the first color light Lr, the second color filter 310G may improve the color reproduction rate of the second color light Lg, and the third color filter 310B may improve the color reproduction rate of the third color light Lb. The third inorganic insulating layer IL3 is on the first color filter 310R, the second color filter 310G, and the third color filter 310B to protect the first color filter 310R, the second color filter 310G, and the third color filter 310B.

Figure 16:
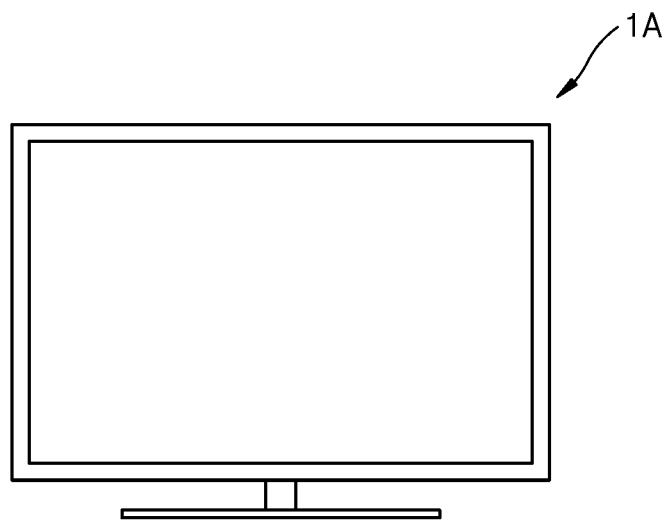
FIGS. 16-18 are diagrams of electronic devices to which a display apparatus according to an embodiment is applied.
Figure 17:
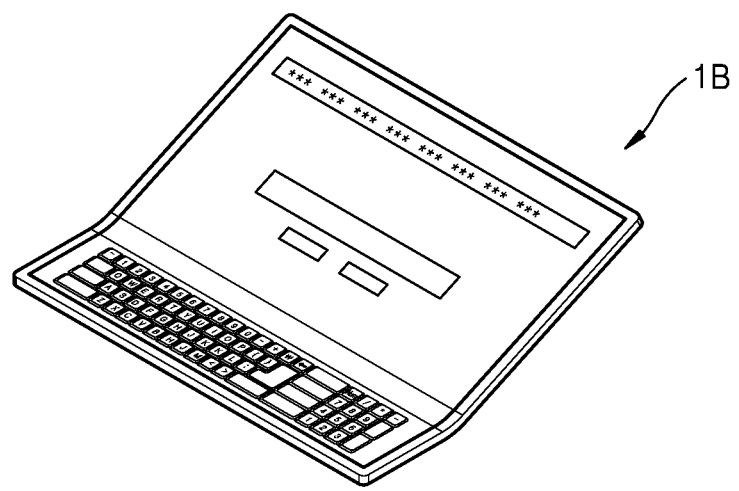
Figure 18:
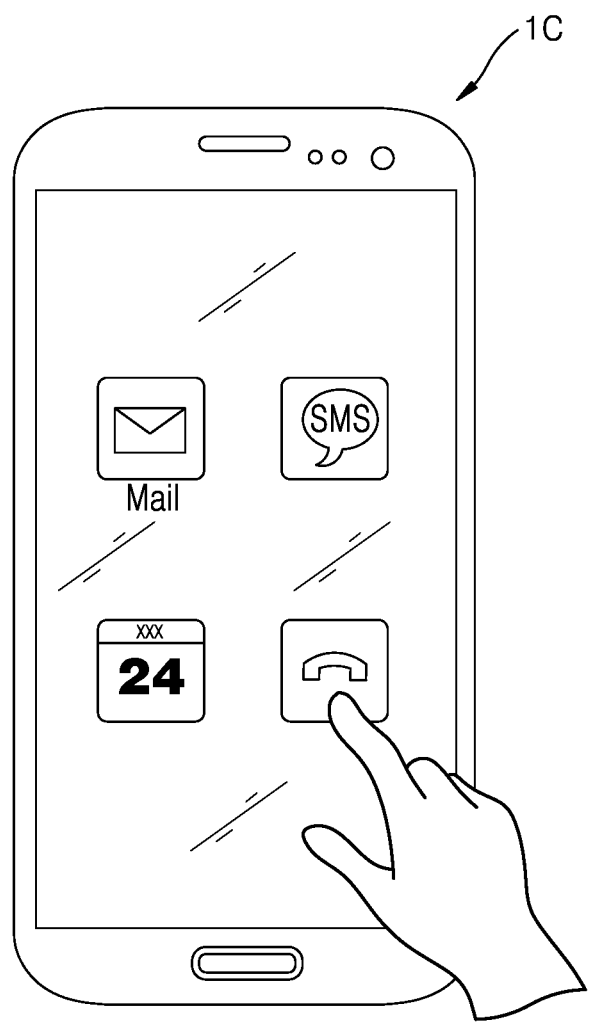

The display apparatus including the above structure may be applied to a television 1A as shown in FIG. 16, a laptop computer or a foldable tablet PC 1B as shown in FIG. 17, or a mobile display device 1C such as a mobile phone as shown in FIG. 18. Alternatively, the display apparatus according to one or more embodiments may be any suitable kind of electronic device provided that the electronic device may provide images, for example, a display portion included in an artificial intelligence or smart speaker.

According to one or more embodiments, the color filter unit having improved optical efficiency and color reproduction and the display apparatus including the color filter unit may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims, and equivalents thereof.

What is claimed is:

1. A display apparatus comprising:
a first pixel, a second pixel, and a third pixel on a first substrate, each of the first pixel, the second pixel, and the third pixel comprising a display element;
a light scattering layer corresponding to the display element of each of the first pixel and the second pixel, the light scattering layer comprising first scattering particles and first quantum dots; and
a color conversion layer on the light scattering layer and corresponding to the display element of each of the first pixel and the second pixel, the color conversion layer comprising second scattering particles and second quantum dots configured to convert incident light into light of a set color, and
wherein a concentration of the first scattering particles in the light scattering layer of the first pixel is different from a concentration of the second scattering particles in the color conversion layer of the first pixel.

2. The display apparatus of claim 1, wherein a concentration of the first quantum dots in the light scattering layer of the first pixel is different from a concentration of the second quantum dots in the color conversion layer of the first pixel.

3. The display apparatus of claim 1, wherein the concentration of the first scattering particles of the first pixel is equal to or greater than twice the concentration of the second scattering particles of the first pixel.

4. The display apparatus of claim 2, wherein the concentration of the second quantum dots of the first pixel is equal to or greater than twice the concentration of the first quantum dots of the first pixel.

5. The display apparatus of claim 1, further comprising:
a second substrate facing the first substrate;
a first transmission layer corresponding to the display element of the third pixel, the first transmission layer comprising the first scattering particles; and
a second transmission layer between the first transmission layer and the second substrate, the second transmission layer comprising the second scattering particles.

6. The display apparatus of claim 5, wherein a concentration of the second scattering particles in the second transmission layer is greater than a concentration of the first scattering particles in the first transmission layer.

7. The display apparatus of claim 6, wherein the third pixel is configured to emit blue light.

8. A display apparatus comprising:
a first pixel, a second pixel, and a third pixel on a first substrate, each of the first pixel, the second pixel, and the third pixel comprising a display element; a light scattering layer corresponding to the display element of each of the first pixel and the second pixel, the light scattering layer comprising first scattering particles and first quantum dots; and a color conversion layer on the light scattering layer and corresponding to the display element of each of the first pixel and the second pixel, the color conversion layer comprising second scattering particles and second quantum dots configured to convert incident light into light of a set color;
a second substrate facing the first substrate;
a first transmission layer corresponding to the display element of the third pixel, the first transmission layer comprising the first scattering particles;
a second transmission layer between the first transmission layer and the second substrate, the second transmission layer comprising the second scattering particles; and
a plurality of color filters respectively corresponding to the first pixel, the second pixel, and the third pixel, the plurality of color filters being configured to selectively transmit light of a set color,
wherein a concentration of the second scattering particles in the second transmission layer is greater than a concentration of the first scattering particles in the first transmission layer, and
wherein the third pixel is configured to emit blue light.

9. The display apparatus of claim 8, further comprising first light blocking layers located among the plurality of color filters.

10. The display apparatus of claim 9, further comprising second light blocking layers respectively between the color conversion layer of the first pixel, the color conversion layer of the second pixel, and the second transmission layer.

11. The display apparatus of claim 10, further comprising third light blocking layers respectively between the light scattering layer of the first pixel, the light scattering layer of the second pixel, and the first transmission layer.

12. The display apparatus of claim 11, wherein a second light blocking layer of the second light blocking layers and a third light blocking layer of the third light blocking layers each have an inversely-tapered side surface.

13. The display apparatus of claim 11, wherein a second light blocking layer of the second light blocking layers and a third light blocking layer of the third light blocking layers each have a tapered side surface.

14. The display apparatus of claim 8, further comprising a first inorganic insulating layer on the plurality of color filters, the color conversion layer of the first pixel, the color conversion layer of the second pixel, and the second transmission layer.

15. A display apparatus comprising:
a first pixel, a second pixel, and a third pixel on a first substrate, the first pixel, the second pixel, and the third pixel being configured to emit light of different colors from one another, wherein each of the first pixel and the second pixel comprises: a display element; a light scattering layer corresponding to the display element, the light scattering layer comprising first scattering particles and first quantum dots; and a color conversion layer on the light scattering layer, the color conversion layer comprising second scattering particles and second quantum dots configured to convert incident light into light of a set color;

a second substrate facing the first substrate;

a first transmission layer corresponding to the third pixel, the first transmission layer comprising the first scattering particles; and a second transmission layer between the first transmission layer and the second substrate, the second transmission layer comprising the second scattering particles;

a plurality of color filters respectively corresponding to the first pixel, the second pixel, and the third pixel, the plurality of color filters being configured to selectively transmit light of a set color; and a second inorganic insulating layer between the color conversion layer of each of the first and second pixels and the light scattering layer of each of the first and second pixels and between the second transmission layer and the first transmission layer, wherein a concentration of the second scattering particles in the second transmission layer is greater than a concentration of the first scattering particles in the first transmission layer, and wherein the third pixel is configured to emit blue light.

16. The display apparatus of claim 8, wherein the plurality of color filters are directly on the second substrate.

17. The display apparatus of claim 8, further comprising a thin film encapsulation layer on the first pixel, the second pixel, and the third pixel, the thin film encapsulation layer comprising an inorganic encapsulation layer and an organic encapsulation layer.

18. The display apparatus of claim 17, wherein the light scattering layer of the first pixel, the light scattering layer of the second pixel, and the first transmission layer are on the thin film encapsulation layer.

19. The display apparatus of claim 11, further comprising a third inorganic insulating layer covering the light scattering layer of the first pixel, the light scattering layer of the second pixel, and the third light blocking layers.

20. The display apparatus of claim 8, wherein the first pixel, the second pixel, and the third pixel respectively further comprise a first light extraction layer, a second light extraction layer, and a third light extraction layer neighboring the plurality of color filters, and wherein each of the first light extraction layer, the second light extraction layer, and the third light extraction layer comprise third scattering particles.

21. The display apparatus of claim 20, wherein the third scattering particles are included in the first light extraction layer, the second light extraction layer, and the third light extraction layer at the same concentration.

22. A color filter unit comprising:

a base material layer;

a plurality of color filters on the base material layer, the plurality of color filters being spaced apart from one another;

a light scattering layer corresponding to at least one of the plurality of color filters; and a color conversion layer between the plurality of color filters and the light scattering layer, the color conversion layer being configured to convert incident light into light of a set color, wherein the light scattering layer comprises first quantum dots and first scattering particles, and the color conversion layer comprises second quantum dots and second scattering particles.

23. The color filter unit of claim 22, wherein a concentration of the first scattering particles in the light scattering layer is greater than a concentration of the second scattering particles in the color conversion layer.

24. The color filter unit of claim 22, wherein a concentration of the second quantum dots in the color conversion layer is greater than a concentration of the first quantum dots in the light scattering layer.

25. The color filter unit of claim 22, further comprising:

a first transmission layer corresponding to at least one of the plurality of color filters; and a second transmission layer between the base material layer and the first transmission layer, wherein the first transmission layer comprises the first scattering particles, and wherein the second transmission layer comprises the second scattering particles.

26. The color filter unit of claim 25, wherein a concentration of the second scattering particles in the second transmission layer is greater than a concentration of the first scattering particles in the first transmission layer.

27. The color filter unit of claim 22, further comprising light blocking layers in spaces among the plurality of color filters.

28. The color filter unit of claim 22, further comprising:

a first inorganic insulating layer between the plurality of color filters and the color conversion layer; and a second inorganic insulating layer between the color conversion layer and the light scattering layer.

* * * * *